(12) United States Patent
Nishio et al.

(10) Patent No.: US 11,069,202 B2
(45) Date of Patent: Jul. 20, 2021

(54) PRODUCT REGISTRATION DEVICE AND POS APPARATUS

(71) Applicants: NEC CORPORATION, Tokyo (JP); NEC PLATFORMS, LTD., Kawasaki (JP)

(72) Inventors: Jun Nishio, Tokyo (JP); Shinichi Matsumoto, Tokyo (JP); Kiyoshi Midorikawa, Kanagawa (JP); Kazuyuki Ohyama, Kanagawa (JP); Mitsuhiro Tokorotani, Kanagawa (JP)

(73) Assignees: NEC CORPORATION, Tokyo (JP); NEC Platforms, Ltd., Kanagawa (JP)

( * ) Notice: Subject to any disclaimer, the term of this patent is extended or adjusted under 35 U.S.C. 154(b) by 0 days.

(21) Appl. No.: 16/345,049

(22) PCT Filed: Aug. 4, 2017

(86) PCT No.: PCT/JP2017/028464
§ 371 (c)(1),
(2) Date: Apr. 25, 2019

(87) PCT Pub. No.: WO2018/079005
PCT Pub. Date: May 3, 2018

(65) Prior Publication Data
US 2019/0279470 A1    Sep. 12, 2019

(30) Foreign Application Priority Data
Oct. 26, 2016 (JP) .............................. JP2016-209205

(51) Int. Cl.
*G07G 1/00* (2006.01)
*G06F 1/16* (2006.01)
(Continued)

(52) U.S. Cl.
CPC ............. *G07G 1/0018* (2013.01); *G06F 1/16* (2013.01); *G07G 1/00* (2013.01); *G07G 1/01* (2013.01);
(Continued)

(58) Field of Classification Search
CPC .......... G07G 1/0018; G07G 1/01; G07G 1/00; G06F 1/16; H05K 5/0017; H05K 5/0204; H05K 5/0217
See application file for complete search history.

(56) References Cited

U.S. PATENT DOCUMENTS 3,663,800 A    5/1972  Myer et al.
5,329,289 A *  7/1994  Sakamoto ................. G06F 1/16
                                                                    248/922

(Continued)

FOREIGN PATENT DOCUMENTS

JP    4-312109 A    11/1992
JP    6-44457 A     2/1994
(Continued)

OTHER PUBLICATIONS

International Search Report for PCT/JP2017/028464 dated Oct. 10, 2017 [PCT/ISA/210].
(Continued)

*Primary Examiner* — James Wu
(74) *Attorney, Agent, or Firm* — Sughrue Mion, PLLC

(57) ABSTRACT

A product registration device (10) includes a casing (100), a support portion (200), and a first display unit (310). The casing (100) accommodates a control unit. The casing (100) is vertically long. The support portion (200) protrudes from the casing (100). The first display unit (310) is supported to the casing (100) by the support portion (200). The first display unit (310) is vertically long. Therefore, a space occupied by the casing (100) in a lateral direction can be
(Continued)

reduced, and a space occupied by the first display unit (310) in the lateral direction can be reduced. Thus, it is possible to reduce a space occupied by the product registration device (10) in the lateral direction.

15 Claims, 28 Drawing Sheets

(51) Int. Cl.
 *H05K 5/00* (2006.01)
 *H05K 5/02* (2006.01)
 *G07G 1/01* (2006.01)
(52) U.S. Cl.
 CPC ......... *H05K 5/0017* (2013.01); *H05K 5/0204* (2013.01); *H05K 5/0217* (2013.01)

(56) References Cited

U.S. PATENT DOCUMENTS

| | | | |
|---|---|---|---|
| 2002/0027533 A1* | 3/2002 | Shishida | G06F 1/1601 345/1.3 |
| 2006/0198094 A1 | 9/2006 | Kano et al. | |
| 2011/0176004 A1* | 7/2011 | Chaussade | G07F 17/32 348/150 |
| 2014/0249950 A1 | 9/2014 | Fukuda | |
| 2017/0345263 A1* | 11/2017 | Gotanda | G07G 1/0036 |

FOREIGN PATENT DOCUMENTS

| | | |
|---|---|---|
| JP | 7-175974 A | 7/1995 |
| JP | 3050306 U | 4/1998 |
| JP | 2002-072898 A | 3/2002 |
| JP | 2003-281628 A | 10/2003 |
| JP | 2003-288643 A | 10/2003 |
| JP | 2003-317150 A | 11/2003 |
| JP | 2005-235237 A | 9/2005 |
| JP | 2006-268036 A | 10/2006 |
| JP | 2007-143010 A | 6/2007 |
| JP | 2009-123027 A | 6/2009 |
| JP | 2010-271713 A | 12/2010 |
| JP | 2011-48657 A | 3/2011 |
| JP | 2013-182485 A | 9/2013 |
| JP | 2014-170403 A | 9/2014 |
| JP | 2015-53029 A | 3/2015 |
| JP | 2016-27390 A | 2/2016 |
| JP | 2018-045318 A | 3/2018 |
| WO | 2009/118817 A1 | 10/2009 |

OTHER PUBLICATIONS

Notice of Reasons for Refusal dated Jun. 30, 2020, from the Japanese Patent Office in Application No. 2016-209205.

* cited by examiner

110 ical Field

The present invention relates to a product registration device and a POS apparatus.

BACKGROUND ART

A point of sales (POS) device may be used for checkout of products in a retail store. As described in Patent Document 1, in such a POS apparatus, peripheral devices that are used in the POS apparatus may be integrated. Further, as described in Patent Document 2, the POS apparatus may include two display units. Specifically, the POS apparatus of Patent Document 2 includes a control unit, a first display unit, and a second display unit. The control unit is vertically long. The first display unit is attached to a front surface of the control unit, and the second display unit is attached to a back surface of the control unit. Both of the first display unit and the second display unit are horizontally long.

Various studies are currently being performed on disposition of a display unit in the field different from the POS apparatus. For example, in Patent Document 3, two display units and, more specifically, two touch screens are used in communication support. Specifically, in Patent Document 3, a first touch screen and a second touch screen are attached to a common post by a first arm and a second arm, respectively. Further, Patent Document 4 describes a technology regarding a television. Specifically, in Patent Document 4, an arm is attached to a back surface of a display unit, and a speaker is supported on the rear side of the display unit by this arm.

RELATED DOCUMENT

Patent Document

[Patent Document 1] Japanese Registered Utility Model No. 3050306
[Patent Document 2] Japanese Unexamined Patent Publication No. 6-44457
[Patent Document 3] Japanese Unexamined Patent Publication No. 2016-27390
[Patent Document 4] Japanese Unexamined Patent Publication No. 2007-143010

SUMMARY OF THE INVENTION

Technical Problem

As described in Patent Document 2, various structures of the POS apparatus are currently being studied. Generally, the size of the POS apparatus is large, and a large space is required to install the POS apparatus. Therefore, it is preferable for a space occupied by the POS apparatus, especially a space occupied by the POS apparatus in a lateral direction to be as small as possible.

An object of the present invention is to reduce a space occupied by a POS apparatus in a lateral direction without impairing convenience.

Solution to Problem

According to the present invention, there is provided a product registration device including a vertically long casing accommodating a control unit, a support portion provided to the casing, and a vertically long first display unit supported to the casing by the support portion.

According to the present invention, there is provided a product registration device including a casing accommodating a control unit, a support portion, and a first display unit supported to the casing by the support portion, in which the casing is a substantially rectangular parallelepiped, a length of a side of the rectangular parallelepiped in a height direction being longer than a length of a short side forming a bottom surface of the rectangular parallelepiped, and the support portion is provided on a side surface of the casing including one long side of the bottom surface.

According to the present invention, there is provided a POS apparatus including a product registration device; and a checkout machine, wherein the product registration device includes a casing accommodating a control unit, a support portion, and a first display unit supported to the casing by the support portion, the casing is a substantially rectangular parallelepiped, a length of a side of the rectangular parallelepiped in a height direction being longer than a length of a short side forming a bottom surface of the rectangular parallelepiped, the support portion is provided on a side surface of the casing including one long side of the bottom surface, and the checkout machine is controlled by the control unit.

Advantageous Effects of Invention

According to the present invention, it is possible to reduce a space occupied by the POS apparatus in the lateral direction.

BRIEF DESCRIPTION OF THE DRAWINGS

Objects described above and other objects, features, and advantages will become more apparent from the following description of preferred example embodiments and the accompanying drawings.

EXAMPLE EMBODIMENT

Figure 1:
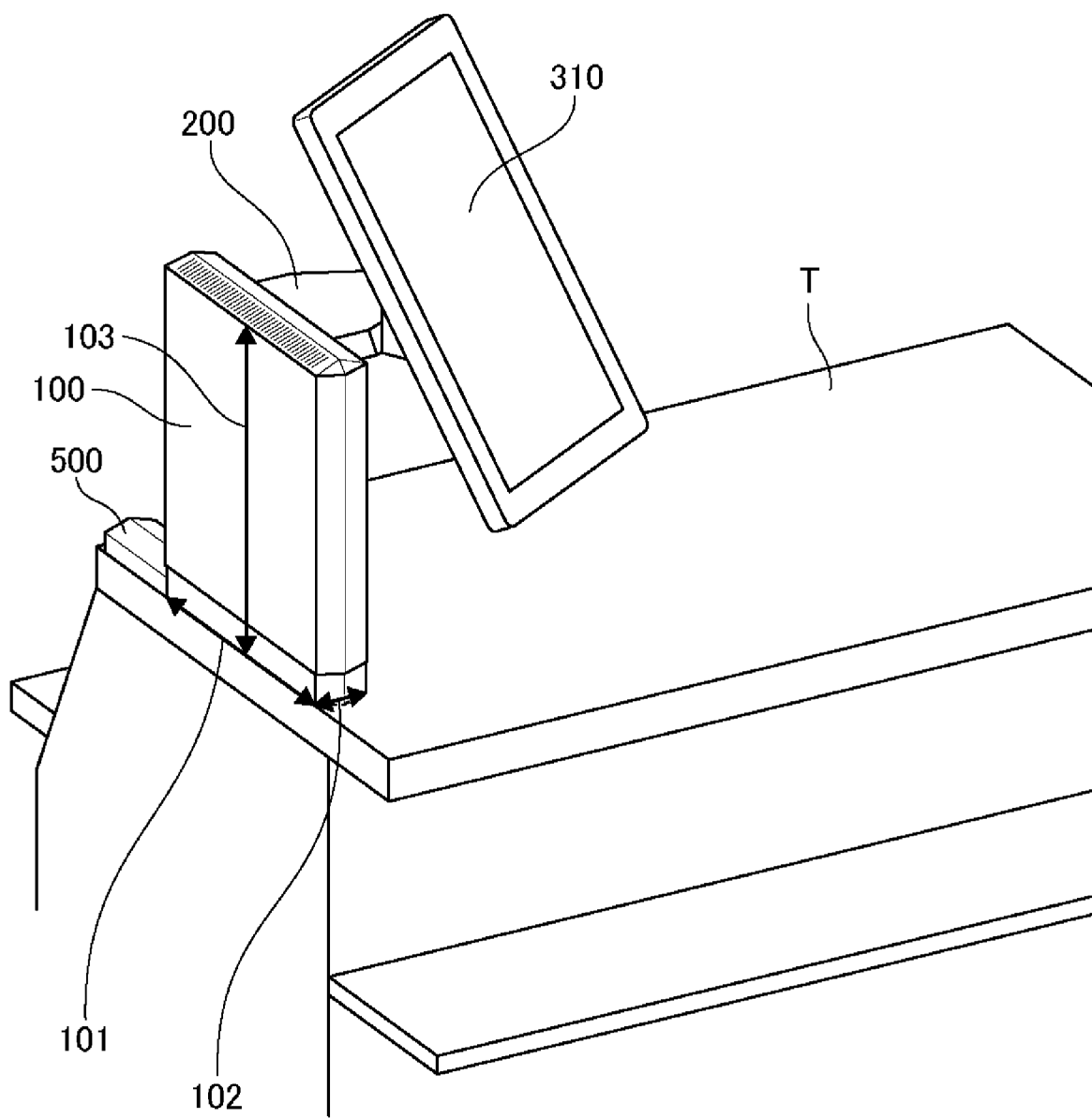
FIG. 1 is a perspective view illustrating a product registration device according to a first example embodiment.

Hereinafter, example embodiments of the present invention will be described with reference to the drawings. In all the drawings, the same components are denoted by the same reference numerals, and description thereof will be appropriately omitted.

First Example Embodiment

Figure 2:
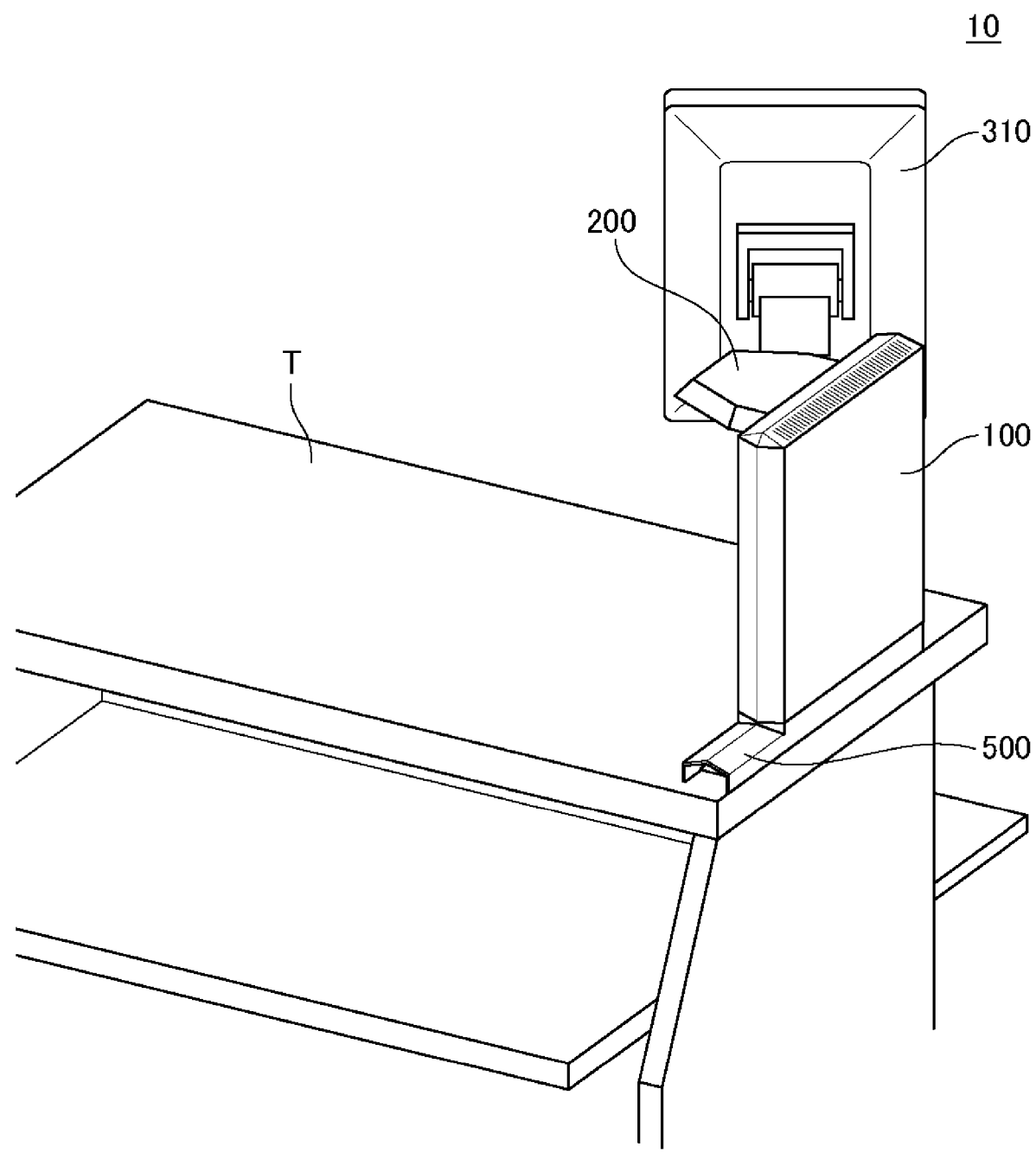
FIG. 2 is a perspective view of the product registration device illustrated in FIG. 1 as viewed in a direction different from that in FIG. 1.

FIG. 1 is a perspective view illustrating a product registration device 10 according to a first example embodiment. FIG. 2 is a perspective view of the product registration device 10 illustrated in FIG. 1 as viewed in a direction different from that in FIG. 1. In the example illustrated in FIGS. 1 and 2, the product registration device 10 is placed on a table T.

The product registration device 10 includes a casing 100, a support portion 200, and a first display unit 310. The casing 100 accommodates a control unit (will be described below with reference to FIG. 3). The casing 100 is vertically long. The support portion 200 protrudes from the casing 100. The first display unit 310 is supported to the casing 100 by the support portion 200. The first display unit 310 is vertically long.

The casing 100 is a rectangular parallelepiped in which a length of a side 103 in a height direction is longer than a length of any side (a long side 101 and a short side 102) of a bottom surface. The casing 100 is configured such that the long side 101 of the bottom surface of the rectangular parallelepiped is disposed to be substantially parallel to a direction in which a clerk or a customer faces when the product registration device 10 is placed on the table T that the clerk or the customer faces.

The support portion 200 has, for example, a prismatic shape. The support portion 200 is provided to the casing 100 such that one side surface of the support portion 200 is in contact with one side surface of the casing 100. The support portion 200 is provided with the first display unit 310 on a side surface of the support portion 200 that is not in contact with the casing 100. As illustrated in FIG. 1, an angle of the side surface of the support portion 200 to which the first display unit 310 is attached with respect to the casing 100 is preferably an angle such that a display surface of the first display unit 310 is directed in a direction in which the customer or the clerk using the product registration device 10 easily visually recognizes the display surface. A shape of the support portion 200 is not limited to the prism and may have other shapes.

The first display unit 310 is rectangular.

The support portion 200 is provided on a side surface of the casing 100 which is surrounded by the side 103 in the height direction and the long side 101 of the bottom surface in the casing 100. That is, the support portion 200 is provided on the side surface of the casing 100 including the long side 101 of the bottom surface of the casing 100.

According to the above configuration, it is possible to reduce a space occupied by the product registration device 10 in a lateral direction. Specifically, both the casing 100 and the first display unit 310 are vertically long. Therefore, a space occupied by the casing 100 in the lateral direction can be reduced, and a space occupied by the first display unit 310 in the lateral direction can be reduced. Thus, according to the above configuration, it is possible to reduce the space occupied by the product registration device 10 in the lateral direction.

Further, in the example illustrated in FIGS. 1 and 2, the first display unit 310 functions as a touch screen. Therefore, a user (for example, a customer or a clerk of a store) of the product registration device 10 can perform a process necessary for registration of products via the first display unit 310. Further, in this case, it is not necessary for a mechanism (for example, a keyboard) for inputting a signal to be used for the process to be provided outside the first display unit 310. Therefore, it is possible to reduce the space occupied by the product registration device 10.

The casing 100 may include an accommodation portion 500 for accommodating a power cord or a network cable. The accommodation portion 500 may be provided integrally with the casing 100 or may be provided to be detachable from the casing 100.

Figure 3:
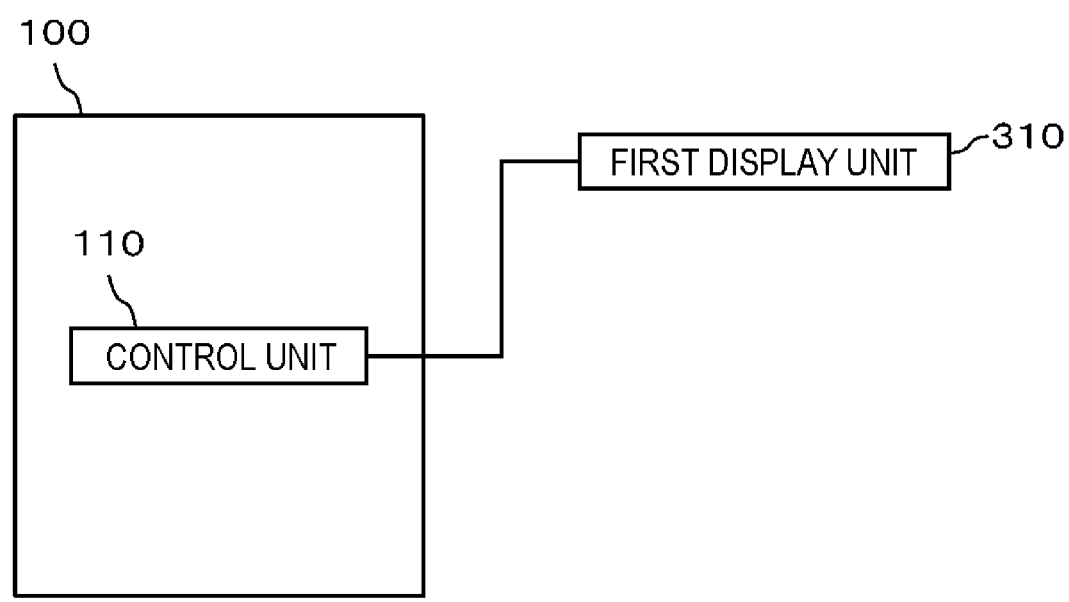
FIG. 3 is a block diagram illustrating the product registration device illustrated in FIGS. 1 and 2.

FIG. 3 is a block diagram illustrating the product registration device 10 illustrated in FIGS. 1 and 2. The product registration device 10 includes the casing 100 and the first display unit 310, as in FIGS. 1 and 2.

The casing 100 accommodates a control unit 110. In an example, the control unit 110 includes a motherboard and an 110 board. In this example, the motherboard and the I/O board can be placed vertically.

The first display unit 310 is controlled by the control unit 110, and more specifically, an image displayed on the first display unit 310 is controlled by the control unit 110. Accordingly, the image displayed on the first display unit 310 can be changed according to a purpose.

The first display unit 310 functions as a touch screen. Therefore, a user (for example, a customer or a clerk of a store) of the product registration device 10 can input a signal necessary for manipulation of the product registration device 10 via the first display unit 310. The signal input via the first display unit 310 is sent to the control unit 110. The control unit 110 performs a process necessary for registration of products (for example, calculation of a total of prices of products) on the basis of this signal.

Figure 4:
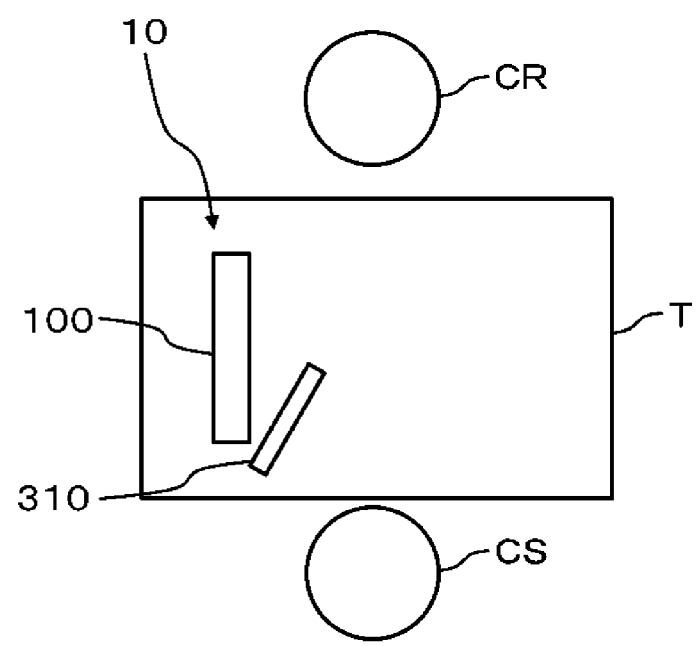
FIG. 4 is a diagram illustrating a first example of a method of using the product registration device illustrated in FIGS. 1 and 2.

FIG. 4 is a diagram illustrating a first example of a method of using the product registration device 10 illustrated in FIGS. 1 and 2. For description, the support portion 200 (FIGS. 1 and 2) is not illustrated in FIG. 4. In the example illustrated in FIG. 4, a customer CS and a clerk CR face each other across the table T. The first display unit 310 is directed to the customer CS. Accordingly, the customer CS can see an image displayed on the first display unit 310. Further, the customer CS can perform a manipulation necessary for registration of products via the first display unit 310 (that is, a touch screen). The example illustrated in FIG. 4 can be applied to a system in a format (self-format) in which the customer CS performs a product registration process and a product price checkout process.

Figure 5:
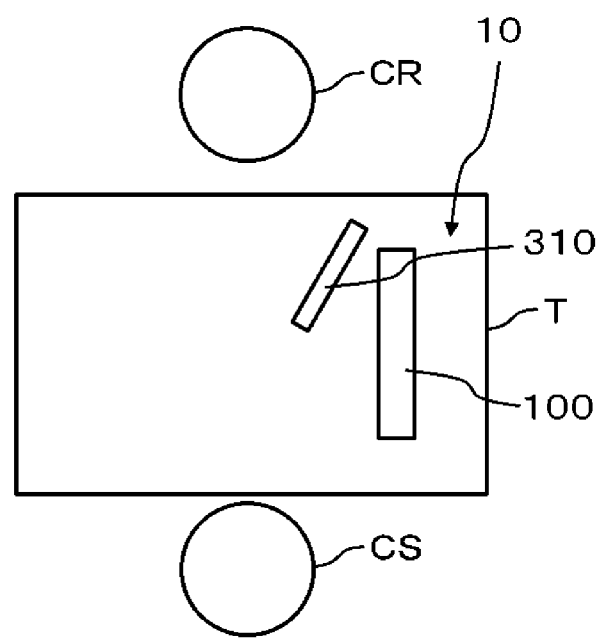
FIG. 5 is a diagram illustrating a second example of the method of using the product registration device illustrated in FIGS. 1 and 2.

FIG. 5 is a diagram illustrating a second example of a method of using the product registration device 10 illustrated in FIGS. 1 and 2. For description, the support portion 200 (FIGS. 1 and 2) is not illustrated in FIG. 5. In the example illustrated in FIG. 5, the customer CS and the clerk CR face each other across the table T. The first display unit 310 is directed to the clerk CR. Accordingly, the clerk CR can see the image displayed on the first display unit 310. Further, the clerk CR can perform a manipulation necessary for registration of products via the first display unit 310 (that is, a touch screen). The example illustrated in FIG. 5 can be applied to a system in a format in which a clerk performs a product registration process and a product price checkout process or in a format in which a clerk performs a product registration process and a customer performs a product price checkout process (semi-self format).

As described above, according to the first example embodiment, it is possible to reduce the space occupied by the product registration device 10 in the lateral direction. Specifically, both the casing 100 and the first display unit 310 are vertically long. Therefore, it is possible to reduce the space occupied by the casing 100 in the lateral direction, and it is possible to reduce the space occupied by the first display unit 310 in the lateral direction. Thus, according to the first example embodiment, it is possible to reduce the space occupied by the product registration device 10 in the lateral direction.

Second Example Embodiment

Figure 6:
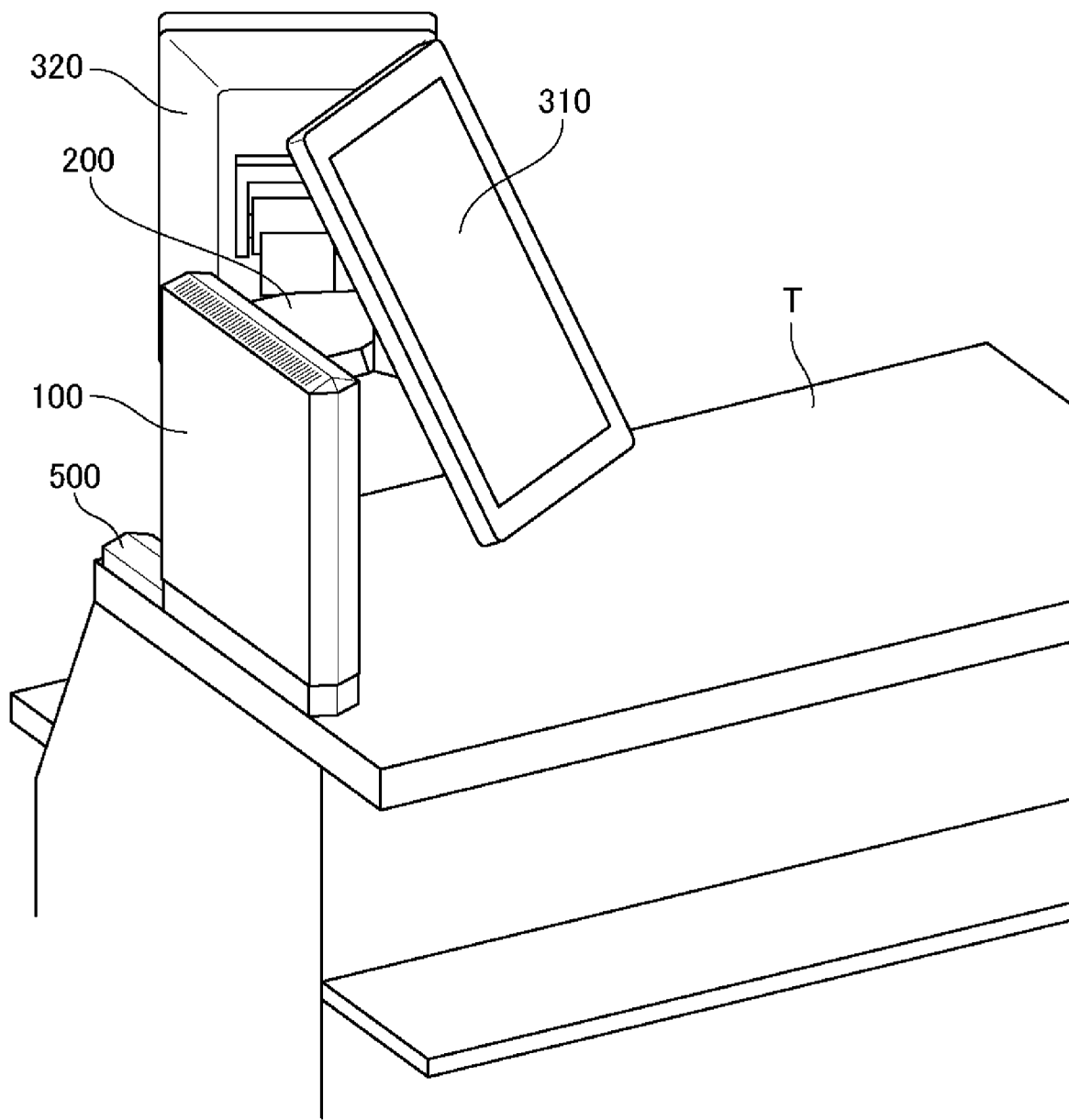
FIG. 6 is a perspective view illustrating a product registration device according to a second example embodiment.
Figure 7:
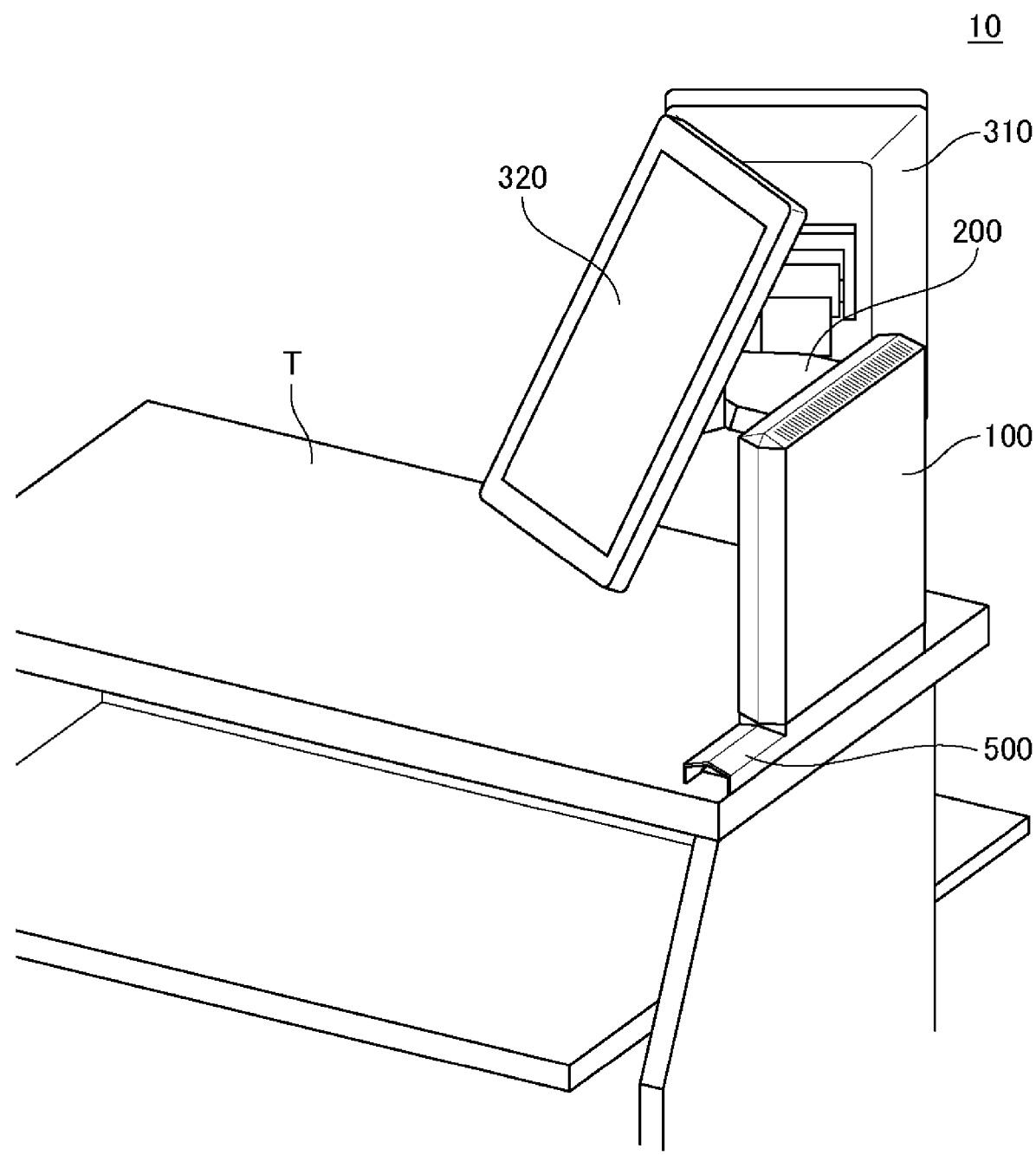
FIG. 7 is a perspective view of the product registration device illustrated in FIG. 6 as viewed in a direction different from that in FIG. 6.

FIG. 6 is a perspective view illustrating a product registration device 10 according to a second example embodiment, and corresponds to FIG. 1 of the first example embodiment. FIG. 7 is a perspective view of the product registration device 10 illustrated in FIG. 6 as viewed in a direction different from that in FIG. 6, and corresponds to FIG. 2 of the first example embodiment. The product registration device 10 according to the second example embodiment is the same as the product registration device 10 according to the first example embodiment except for the following points.

The product registration device 10 includes two display units, that is, a first display unit 310 and a second display unit 320. The first display unit 310 and the second display unit 320 are supported to the casing 100 by the support portion 200. The first display unit 310 and the second display unit 320 are directed in different directions and, specifically, face opposite sides.

Both of the first display unit 310 and the second display unit 320 are vertically long. Therefore, it is possible to reduce a space occupied by the first display unit 310 in the lateral direction, and it is possible to reduce the space occupied by the second display unit 320 in the lateral direction. Thus, it is possible to reduce the space occupied by the product registration device 10 in the lateral direction.

The first display unit 310 functions as a touch screen. Therefore, a user (for example, a customer of a store) of the product registration device 10 can perform a process necessary for registration of products via the first display unit 310. Further, in this case, it is not necessary for a mechanism (for example, a keyboard) for inputting a signal to be used for the process to be provided outside the first display unit 310. Therefore, it is possible to reduce the space occupied by the product registration device 10.

The second display unit 320 functions as a touch screen. Therefore, the user (for example, a clerk of the store) of the product registration device 10 can perform a process necessary for registration of products via the second display unit 320. Further, in this case, it is unnecessary for a mechanism (for example, a keyboard) for inputting a signal to be used for the process to be provided outside the second display unit 320. Therefore, it is possible to reduce the space occupied by the product registration device 10.

Figure 8:
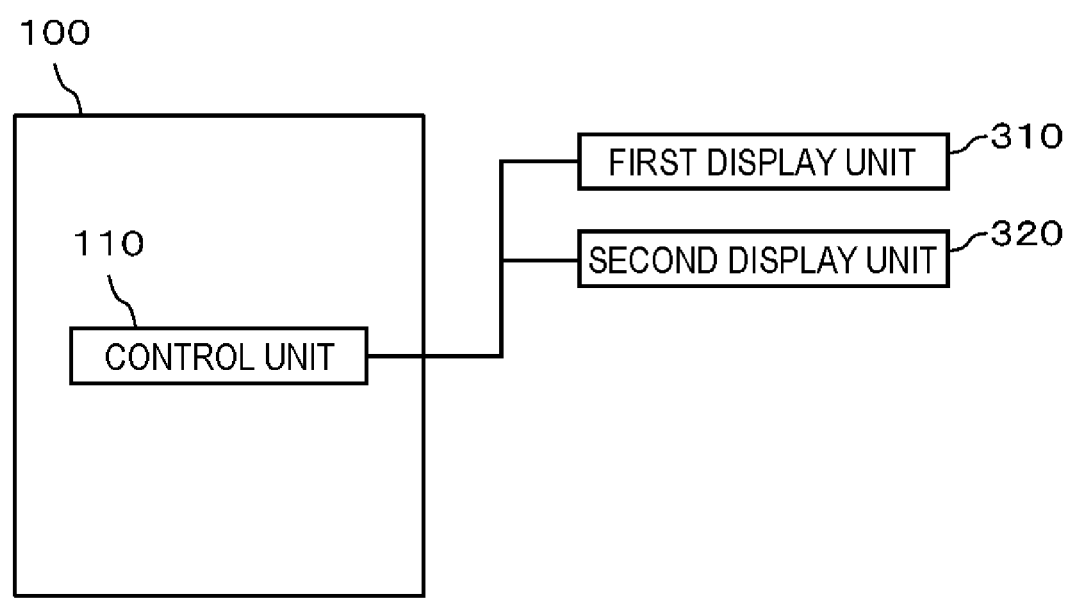
FIG. 8 is a block diagram illustrating the product registration device illustrated in FIGS. 6 and 7.

FIG. 8 is a block diagram illustrating the product registration device 10 illustrated in FIGS. 6 and 7, and corresponds to FIG. 3 of the first example embodiment. The product registration device 10 includes the casing 100, the first display unit 310, and the second display unit 320, as in FIGS. 6 and 7.

The first display unit 310 is controlled by the control unit 110, and more specifically, the image displayed on the first display unit 310 is controlled by the control unit 110. Accordingly, an image displayed on the first display unit 310 can be changed according to a purpose.

The second display unit 320 is controlled by the control unit 110, and more specifically, an image displayed on the second display unit 320 is controlled by the control unit 110. Thus, the image displayed on the second display unit 320 can be changed according to a purpose.

The first display unit 310 functions as a touch screen. Therefore, a user (for example, a customer of a store) of the product registration device 10 can input a signal necessary for a manipulation of the product registration device 10 via the first display unit 310. The signal input via the first display unit 310 is sent to the control unit 110. The control unit 110 performs a process (for example, calculation of a total of prices of products) necessary for registration of the products on the basis of this signal.

The second display unit 320 functions as a touch screen. Therefore, a user (for example, a clerk of the store) of the product registration device 10 can input a signal necessary for a manipulation of the product registration device 10 via the second display unit 320. The signal input via the second display unit 320 is sent to the control unit 110. The control unit 110 performs a process (for example, calculation of a total of prices of products) necessary for registration of the products on the basis of this signal.

Figure 9:
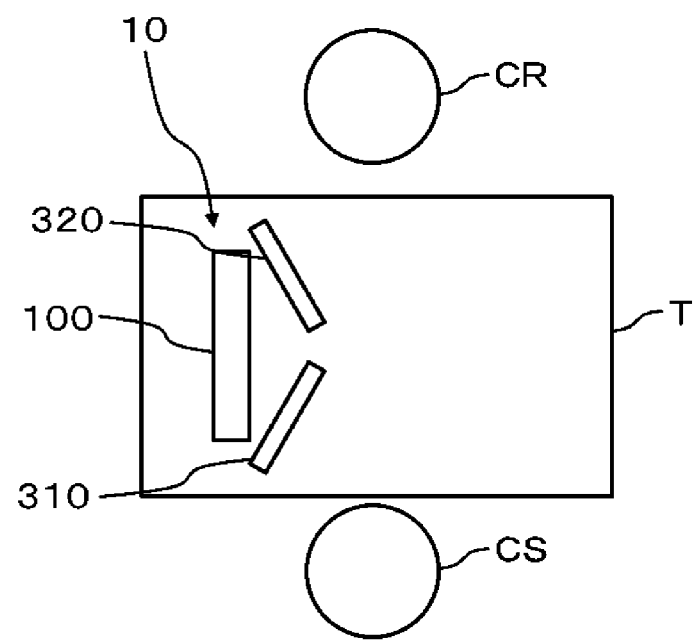
FIG. 9 is a view illustrating an example of a method of using the product registration device illustrated in FIGS. 6 and 7.

FIG. 9 is a diagram illustrating an example of a method of using the product registration device 10 illustrated in FIGS. 6 and 7 and corresponds to FIG. 4 or 5 of the first example embodiment. For description, the support portion 200 (FIGS. 6 and 7) is not illustrated in FIG. 9. In the example illustrated in FIG. 9, the customer CS and the clerk CR face each other across the table T. The example illustrated in FIG. 9 can be applied to a system in a format in which a clerk performs a product registration process and a product price checkout process, a semi-self format, and a self format.

The first display unit 310 is directed to the customer CS. Accordingly, the customer CS can see the image displayed on the first display unit 310. Further, the customer CS can perform a manipulation necessary for registration of products via the first display unit 310 (that is, the touch screen).

The second display unit 320 is directed to the clerk CR. Accordingly, the clerk CR can see the image displayed on the second display unit 320. Further, the clerk CR can perform a manipulation necessary for registration of products via the second display unit 320 (that is, the touch screen).

As described above, according to the present example embodiment, it is possible to reduce the space occupied by the product registration device 10 in the lateral direction. Specifically, the product registration device 10 includes two display units, that is, the first display unit 310 and the second display unit 320. Both of the first display unit 310 and the second display unit 320 are vertically long. Therefore, it is possible to reduce the space occupied by the first display unit 310 in the lateral direction, and it is possible to reduce the space occupied by the second display unit 320 in the lateral direction. Thus, according to the present example embodiment, it is possible to reduce the space occupied by the product registration device 10 in the lateral direction.

Further, according to the present example embodiment, the customer of the store and the clerk can use different display units. Specifically, the customer of the store can use one of the first display unit 310 and the second display unit 320, and the clerk of the store can use the other of the first display unit 310 and the second display unit 320. Thus, according to the present example embodiment, the customer and the clerk of the store can use different display units.

Third Example Embodiment

Figure 10:
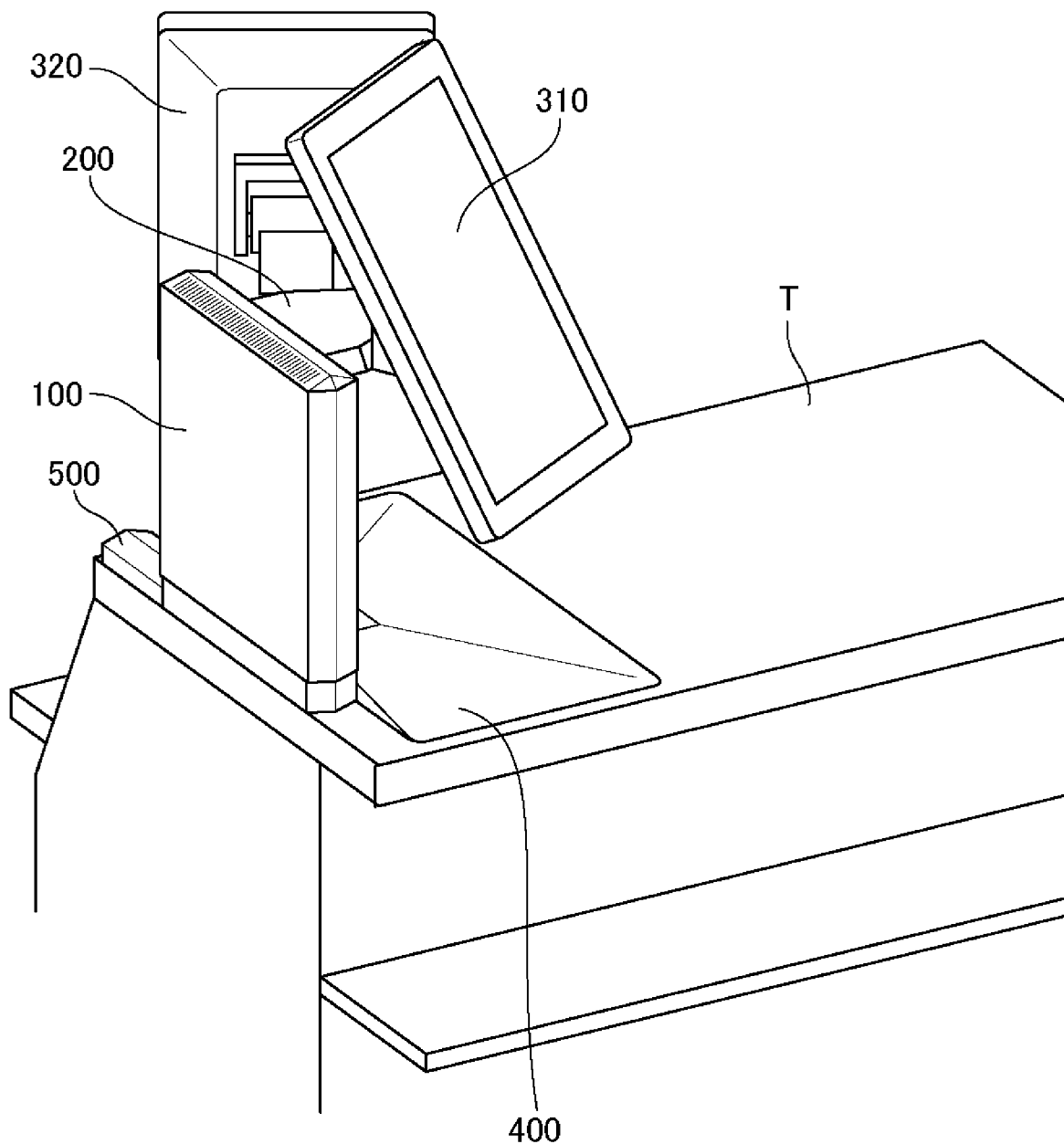
FIG. 10 is a perspective view illustrating a product registration device according to a third example embodiment.
Figure 11:
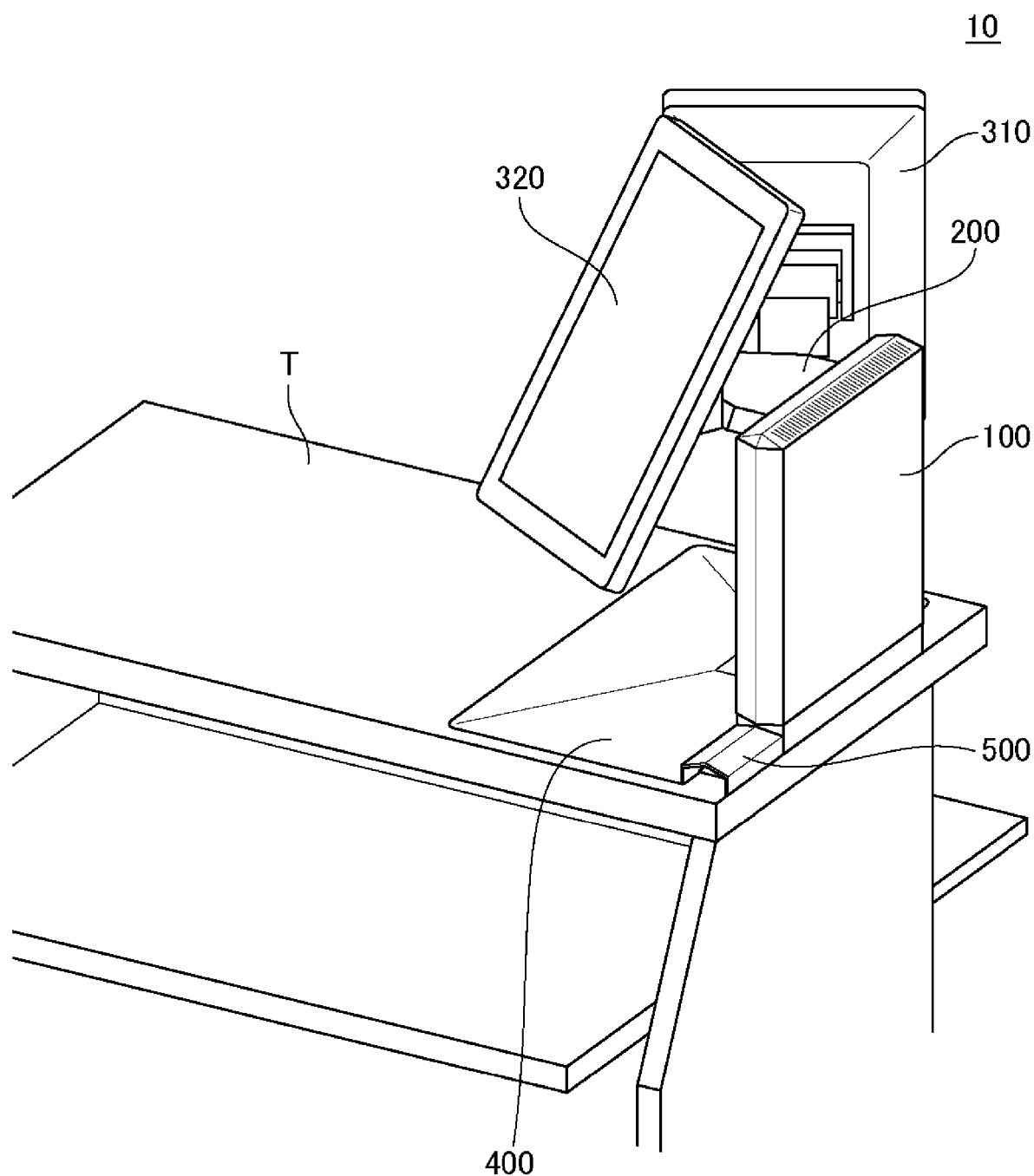
FIG. 11 is a perspective view of the product registration device illustrated in FIG. 10 as viewed in a direction different from that in FIG. 10.

FIG. 10 is a perspective view illustrating a product registration device 10 according to a third example embodiment, and corresponds to FIG. 6 of the second example embodiment. FIG. 11 is a perspective view of the product registration device 10 illustrated in FIG. 10 as viewed in a direction different from that in FIG. 10, and corresponds to FIG. 7 of the second example embodiment. The product registration device 10 according to the present example embodiment is the same as the product registration device 10 according to the second example embodiment except for the following points.

The product registration device 10 includes a basis (hereinafter referred to as a base) 400. The base 400 extends from the side of the casing 100 to the outside of the casing 100. When viewed from top of the product registration device 10, the base 400 overlaps the support portion 200, the first display unit 310, and the second display unit 320. In the example illustrated in FIG. 10, the base 400 spreads to the side of the casing 100 to which the support portion 200 that supports the first display unit 310 and the second display unit 320 is provided. Accordingly, it is possible to maintain stability of the casing 100 when the product registration device 10 is placed on the table T.

The base 400 is attached to the casing 100. The base 400 can be detached from the casing 100. Therefore, for example, when the product registration device 10 is moved, the base 400 can be detached from the casing 100. In this case, the product registration device 10 can be easily moved.

Figure 12:
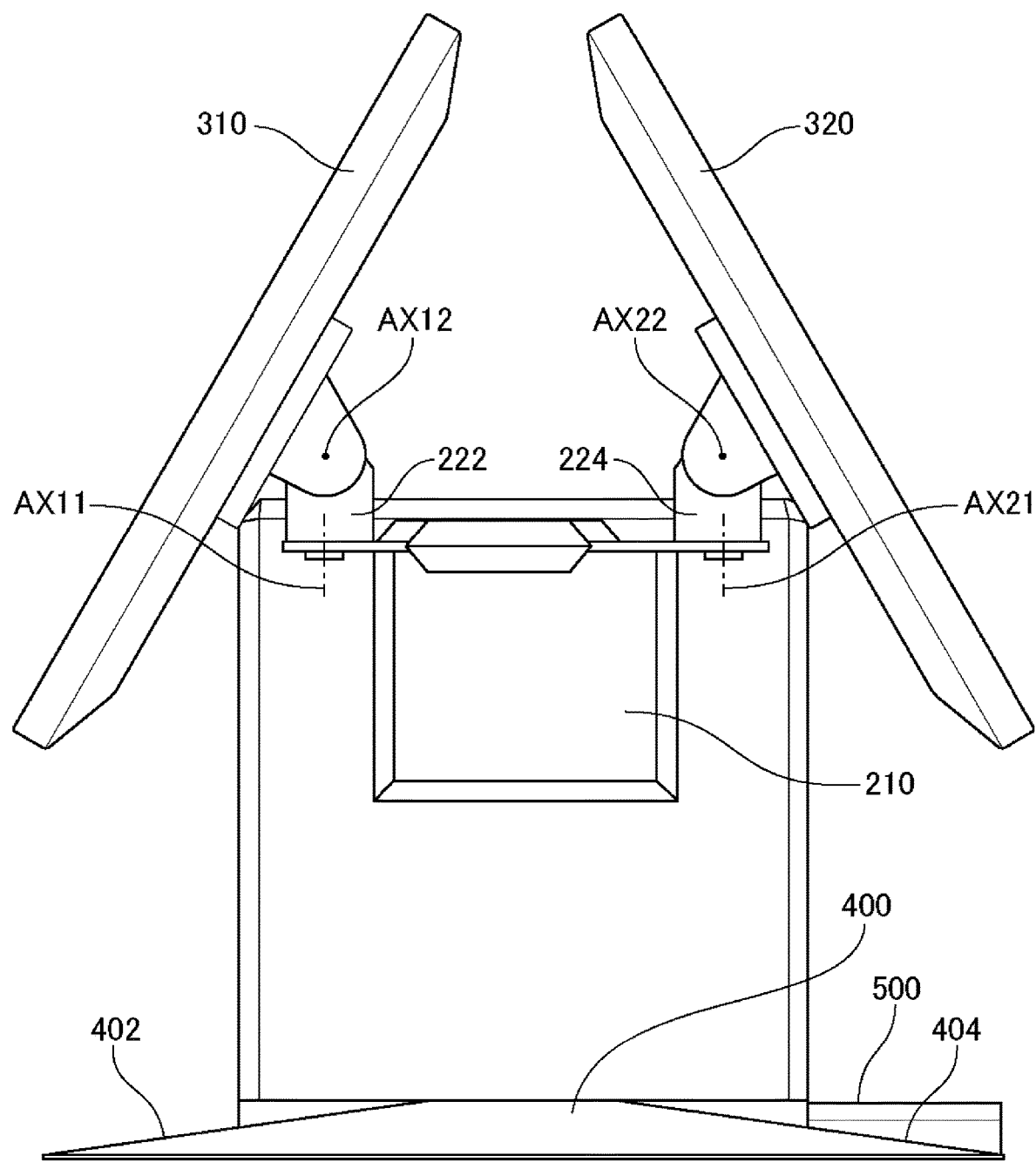
FIG. 12 is a side view of the product registration device illustrated in FIGS. 10 and 11.

FIG. 12 is a side view of the product registration device 10 illustrated in FIGS. 10 and 11. As illustrated in FIG. 12, the support portion 200 includes a first support member 210, a second support member 222, and a second support member 224. The base 400 has an inclined surface 402 and an inclined surface 404.

The first display unit 310 is movably supported to the casing 100 by the support portion 200. Specifically, the first support member 210 is fixed to the casing 100. The second support member 222 is movably attached to the first support member 210. Specifically, the second support member 222 is rotatable about a rotation axis (an axis AX11 in the figure) extending in a first direction (a vertical direction in the example illustrated in FIG. 12). The first display unit 310 is movably attached to the second support member 222. Specifically, the first display unit 310 is rotatable about a rotation axis (an axis AX12 in the figure) extending in a second direction (a horizontal direction in the example illustrated in FIG. 12). By rotating the second support member 222 about the axis AX11 and rotating the first display unit 310 about the axis AX12, the first display unit 310 can be directed in any direction in a movable range of the support portion 200. Thus, the first display unit 310 is movably supported to the casing 100. That is, the first display unit 310 is rotatable in the horizontal direction due to the rotation of the second support member 222 about the axis AX11 as the axis. Further, the first display unit 310 is rotatable in the vertical direction about the axis AX12 as an axis.

The second display unit 320 is movably supported to the casing 100 by the support portion 200. Specifically, the first support member 210 is fixed to the casing 100. The second support member 224 is movably attached to the first support member 210. Specifically, the second support member 224 is rotatable about a rotation axis (an axis AX21 in the figure) extending in the first direction (the vertical direction in the example illustrated in FIG. 12). The second display unit 320 is movably attached to the second support member 224. Specifically, the second display unit 320 is rotatable about a rotation axis (an axis AX22 in the figure) extending in the second direction (the horizontal direction in the example illustrated in FIG. 12). By rotating the second support member 224 about the axis AX21 and rotating the second display unit 320 about the axis AX22, the second display unit 320 can be directed in any direction in a movable range of the support portion 200. Thus, the second display unit 320 is movably supported to the casing 100. That is, the second display unit 320 is rotatable in the horizontal direction due to the rotation of the second support member 224 about the axis AX21 as an axis. Further, the second display unit 320 is rotatable in the vertical direction about the axis AX22 as an axis.

The first display unit 310 and the second display unit 320 may be rotatable only in the horizontal direction or may be rotatable only in the vertical direction. Further, another rotatable member can be adopted as the support portion 200.

The first direction (an extending direction of the axes AX11 and AX21) and the second direction (an extending direction of the axes AX12 and AX22) are not limited to the example illustrated in FIG. 12. When the first direction and the second direction are directed in different directions, the first display unit 310 and the second display unit 320 can be directed in any direction in the movable range of the support portion 200. Therefore, the first direction may be inclined from the vertical direction, and the second direction may be inclined from the horizontal direction.

A structure of the base will be described with reference to FIG. 12. The base 400 has an inclination descending from a side of the base 400 on which the casing 100 is installed to three sides other than the side on which the casing 100 is installed, as shown by the inclined surface 402, the inclined surface 404 and an inclined surface 406 in FIG. 12. That is, the base 400 has an inclination in a direction away from the casing 100. For example, when the customer CS stands on the first display unit 310 side, the clerk CR stands on the second display unit 320 side, and the customer CS and clerk CR use the product registration device 10 as illustrated in FIG. 9, a device (a payment device) for reading at least one of the electronic money and the credit card may be placed on the inclined surface 402. A payment terminal is obliquely installed by placing the payment device on the inclined surface 402, such that it is easy for the customer CS to visually recognize a portion with which the electronic money contacts or a portion to which password number of the credit card is input, and reading of the electronic money or input of the password number of the credit card can be easily performed. Further, oblique placement of the payment terminal enables the customer CS to cause the electronic money or the like to come into contact with the payment terminal while holding the electronic money or the like, thereby preventing leaving the electronic money.

Figure 13:
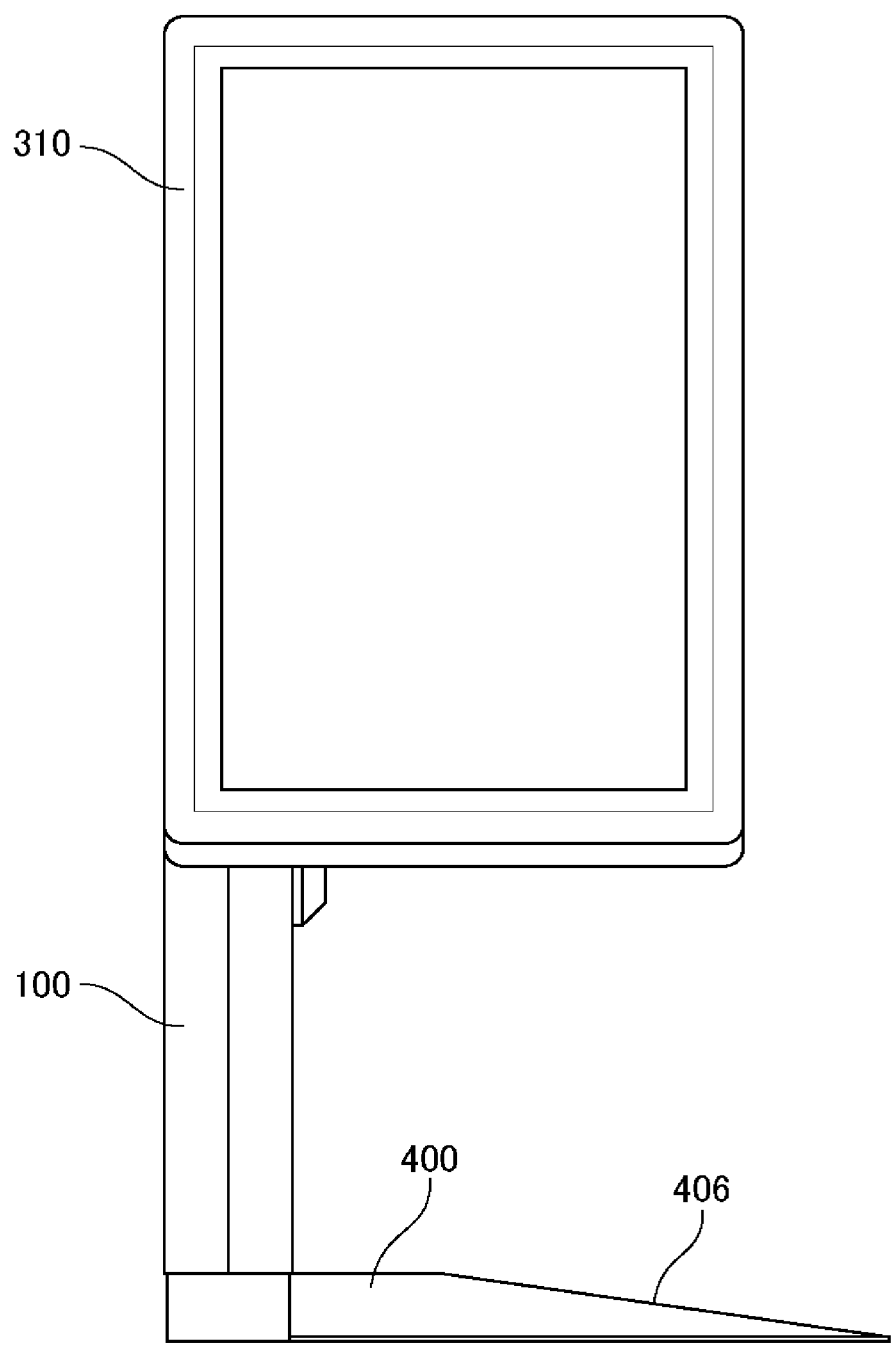
FIG. 13 is a front view of the product registration device illustrated in FIGS. 10 and 11.

FIG. 13 is a front view of the product registration device 10 illustrated in FIGS. 10 and 11. In FIG. 13, the first display unit 310 is located in front of the casing 100. Further, in FIG. 13, the support portion 200 supports the first display unit 310 such that a display surface of the first display unit 310 is perpendicular to a depth direction of the casing 100.

The base 400 has the inclined surface 406. The inclined surface 406 is inclined upwardly from an end portion of the base 400 to the casing 100. For example, when the customer CS stands on the first display unit 310 side and the clerk CR stands on the second display unit 320 side and the customer CS and clerk CR use the product registration device 10 as illustrated in FIG. 9, a barcode hand scanner may be placed on the inclined surface 406. The barcode hand scanner is obliquely placed by placing the barcode hand scanner on the inclined surface 406. Thus, it is easy for the clerk CR to take the barcode hand scanner at the time of product registration, and work efficiency is improved.

Figure 14:
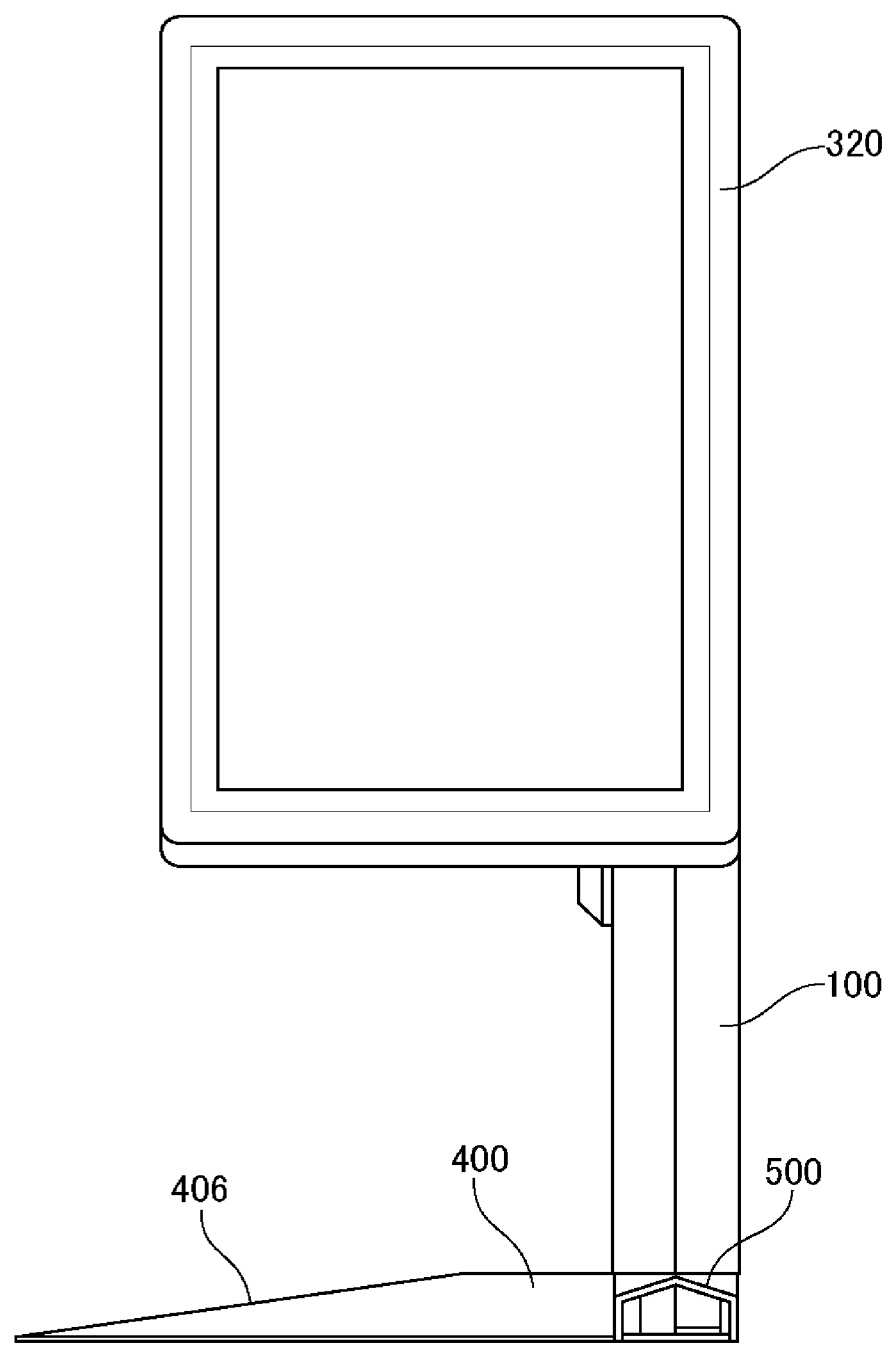
FIG. 14 is a rear view of the product registration device illustrated in FIGS. 10 and 11.

FIG. 14 is a rear view of the product registration device 10 illustrated in FIGS. 10 and 11. In FIG. 14, the second display unit 320 is located in front of the casing 100. Further, in FIG. 14, the support portion 200 supports the second display unit 320 such that a display surface of the second display unit 320 is perpendicular to a depth direction of the casing 100. That is, the display surface of the first display unit 310 and the display surface of the second display unit 320 are directed in different directions.

The base 400 has the inclined surface 406. The inclined surface 406 is inclined upwardly from an end portion of the base 400 to the casing 100.

Figure 15:
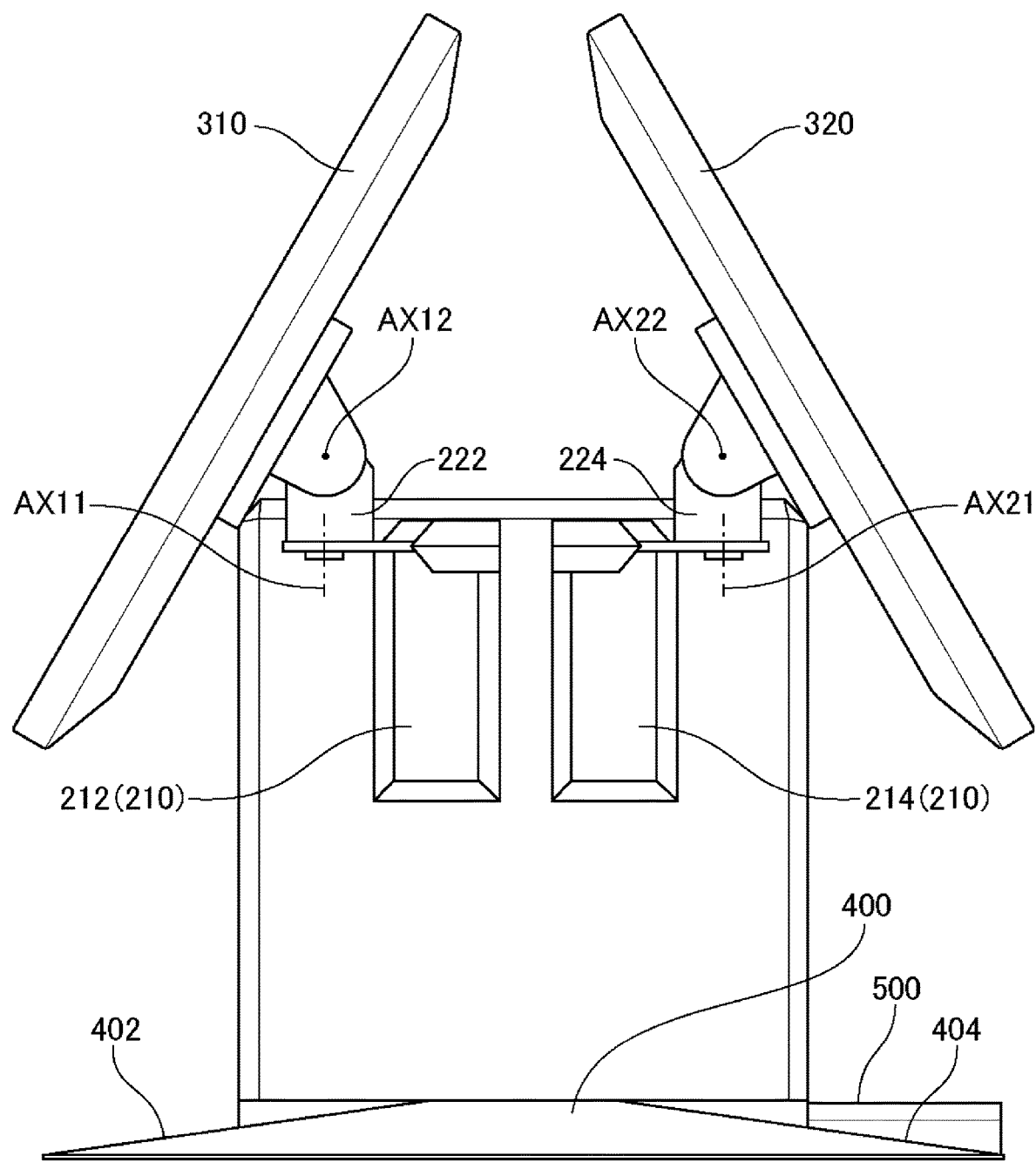
FIG. 15 is a view illustrating a modification example of FIG. 12.

FIG. 15 is a diagram illustrating a modification example of FIG. 12. In the example illustrated in FIG. 15, the support portion 200 has a first support member 210, a second support member 222, and a second support member 224. The first support member 210 includes a first support member 212 and a first support member 214. The first support member 212 and the first support member 214 are spaced apart from each other.

In the example illustrated in FIG. 15, the first display unit 310 is movably supported to the casing 100 by the support portion 200, similar to the example illustrated in FIG. 12. Specifically, the first support member 212 is fixed to the casing 100. The second support member 222 is movably attached to the first support member 212. Specifically, the second support member 222 is rotatable about a rotation axis (an axis AX11 in the figure) extending in a first direction (a vertical direction in the example illustrated in FIG. 15). The first display unit 310 is movably attached to the second support member 222. Specifically, the first display unit 310 is rotatable about a rotation axis (an axis AX12 in the figure) extending in a second direction (a horizontal direction in the example illustrated in FIG. 12). By rotating the second support member 222 about the axis AX11 and rotating the first display unit 310 about the axis AX12, the first display unit 310 can be directed in any direction in a movable range of the support portion 200. Thus, the first display unit 310 is movably supported to the casing 100.

In the example illustrated in FIG. 15, the second display unit 320 is movably supported to the casing 100 by the support portion 200, similar to the example illustrated in FIG. 12. Specifically, the first support member 214 is fixed to the casing 100. The second support member 224 is movably attached to the first support member 214. Specifically, the second support member 224 is rotatable about a rotation axis (an axis AX21 in the figure) extending in the first direction (the vertical direction in the example illustrated in FIG. 12). The second display unit 320 is movably attached to the second support member 224. Specifically, the second display unit 320 is rotatable about a rotation axis (an axis AX22 in the figure) extending in the second direction (the horizontal direction in the example illustrated in FIG. 12). By rotating the second support member 224 about the axis AX21 and rotating the second display unit 320 about the axis AX22, the second display unit 320 can be directed in any direction in a movable range of the support portion 200. Thus, the second display unit 320 is movably supported to the casing 100.

Fourth Example Embodiment

Figure 16:
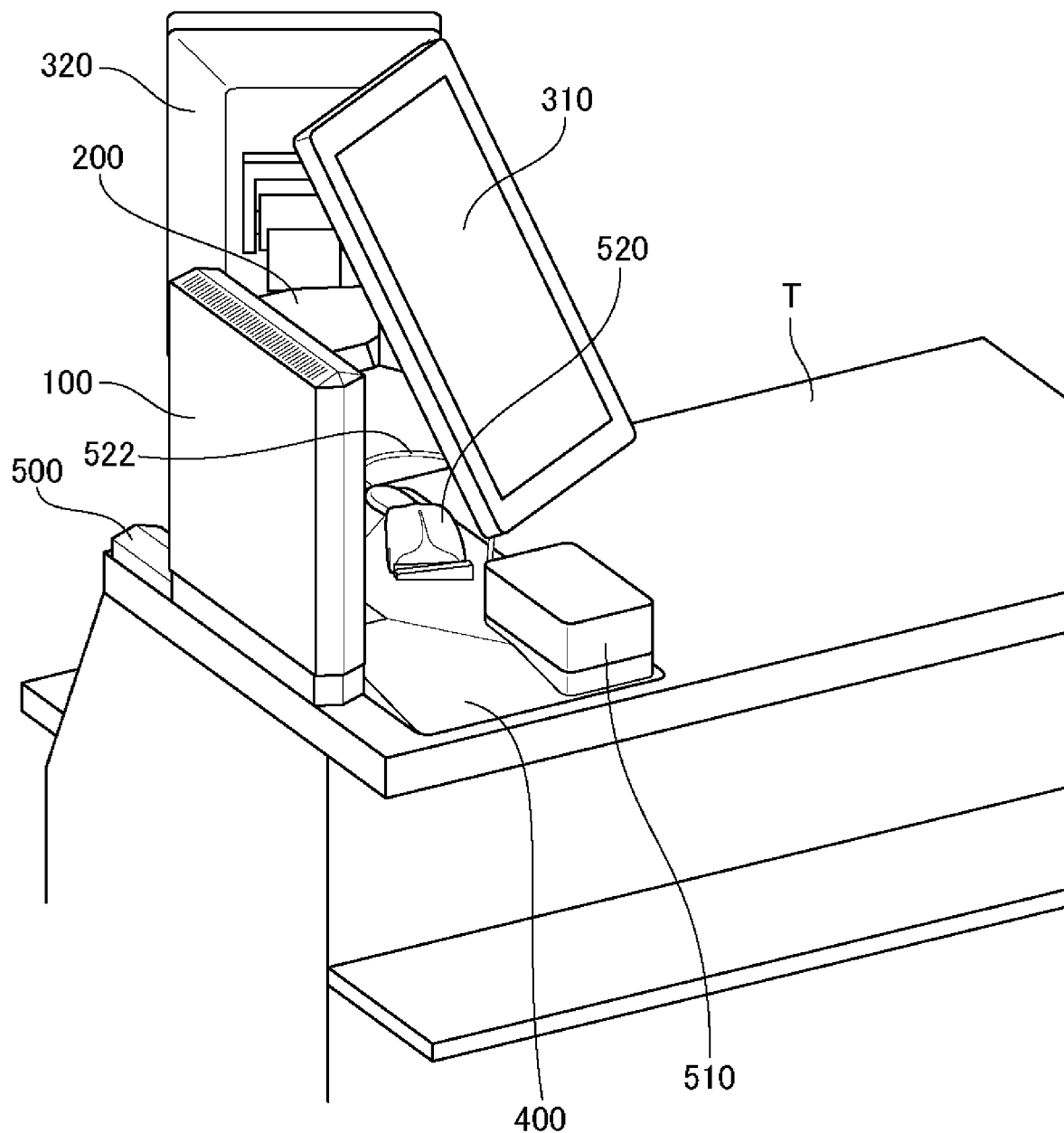
FIG. 16 is a perspective view illustrating a product registration device according to a fourth example embodiment.
Figure 17:
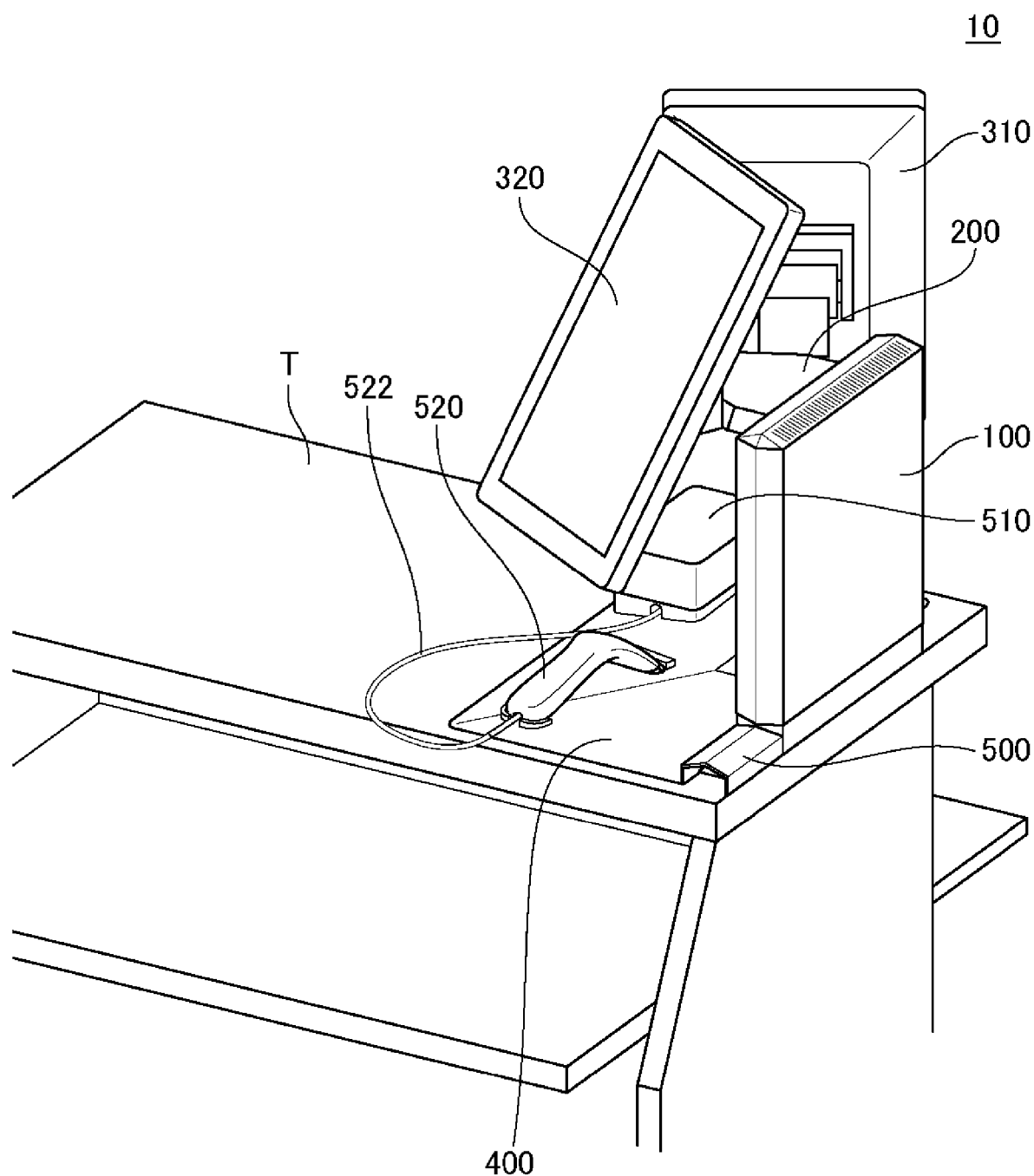
FIG. 17 is a perspective view of the product registration device illustrated in FIG. 16 as viewed in a direction different from that in FIG. 16.

FIG. 16 is a perspective view illustrating a product registration device 10 according to a fourth example embodiment, and corresponds to FIG. 10 of the third example embodiment. FIG. 17 is a perspective view of the product registration device 10 illustrated in FIG. 16 as viewed in a direction different from that in FIG. 16, and corresponds to FIG. 11 of the third example embodiment. The product registration device 10 according to the fourth example embodiment is the same as the product registration device 10 according to the third example embodiment except for the following points.

The product registration device 10 includes a read unit 510 and a read unit 520. The read unit 510 is located on the first display unit 310 side outside the casing 100. The read unit 520 is attached to the read unit 510 via a cable 522 outside the casing 100.

The read unit 510 can read at least one of electronic money and a credit card. Therefore, a user (for example, the customer of the store) of the product registration device 10 can pay the electronic money or can use the credit card by using the read unit 510.

The read unit 510 is attached to the base 400. The read unit 510 can be detached from the base 400. Therefore, for example, when the product registration device 10 is moved, the read unit 510 can be removed from the base 400. In this case, the product registration device can be easily moved.

The read unit 520 is capable of reading a product identification code (for example, a one-dimensional code or a two-dimensional code). In particular, in the examples illustrated in FIGS. 16 and 17, the read unit 520 is a barcode reader (a barcode hand scanner). However, the read unit 520 is not limited to the barcode reader. The user (for example, a clerk of a store) of the product registration device 10 can register products through the read unit 520.

The read unit 510 and the read unit 520 are integrated via the cable 522. Therefore, for example, when the product registration device 10 is moved, the read unit 510, the read unit 520, and the cable 522 can be integrally moved by removing the read unit 510 from the base 400.

Figure 18:
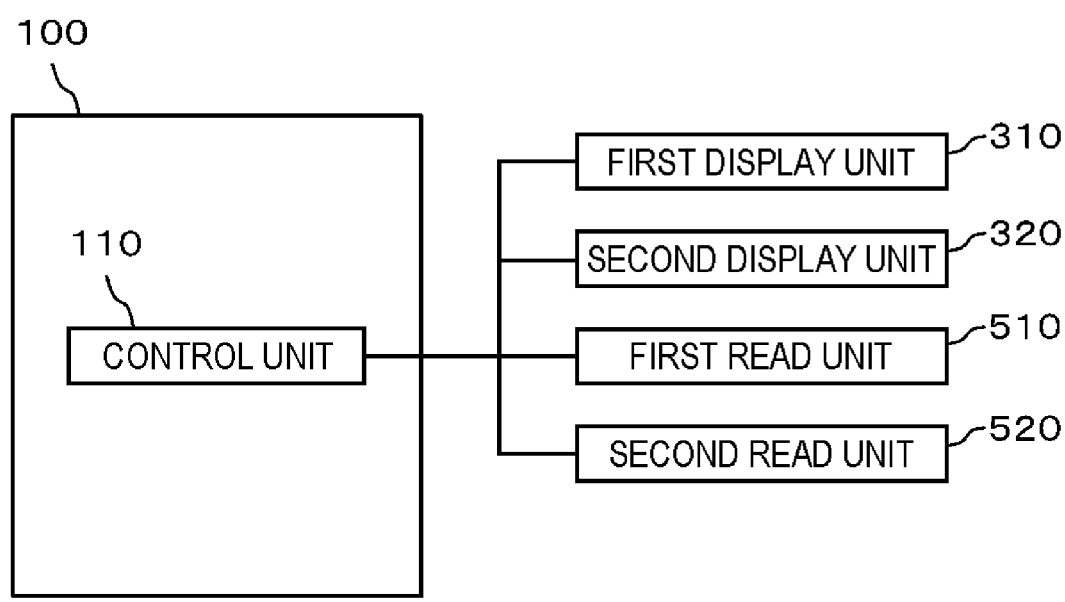
FIG. 18 is a block diagram illustrating the product registration device illustrated in FIGS. 16 and 17.

FIG. 18 is a block diagram illustrating the product registration device 10 illustrated in FIGS. 16 and 17, and corresponds to FIG. 8 of the second example embodiment. The product registration device 10 includes the casing 100, the first display unit 310, the second display unit 320, the read unit 510, and the read unit 520, similar to FIGS. 16 and 17. The product registration device 10 illustrated in FIG. 18 is the same as the product registration device 10 illustrated in FIG. 8 except for the following points.

The read unit 510 can read at least one of the electronic money and the credit card, as described with reference to FIGS. 16 and 17. A signal indicating a reading result of the read unit 510 is sent to the control unit 110. The control unit 110 performs a process necessary for checkout of the product (for example, calculation of a sum of payment amounts) on the basis of this signal.

The read unit 520 can read the product identification code, as described with reference to FIGS. 16 and 17. A signal indicating a reading result of the read unit 520 is sent to the control unit 110. The control unit 110 performs a process necessary for registration of products (for example, calculation of a total of prices of products) on the basis of this signal.

Figure 19:
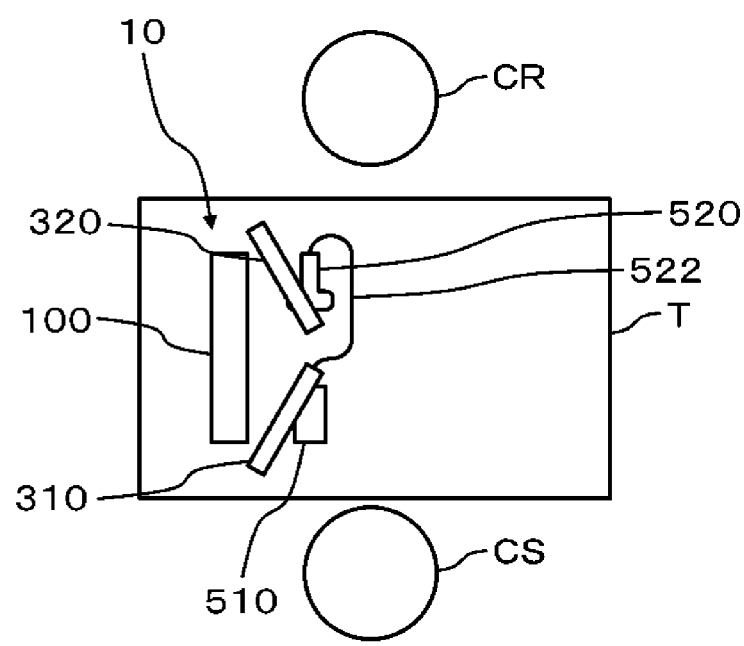
FIG. 19 is a diagram illustrating an example of a method of using the product registration device illustrated in FIGS. 16 and 17.

FIG. 19 is a diagram illustrating an example of a method of using the product registration device 10 illustrated in FIGS. 16 and 17 and corresponds to FIG. 9 of the second example embodiment. For description, the support portion 200 and the base 400 (FIGS. 16 and 17) are not illustrated in FIG. 19. The method illustrated in FIG. 19 is the same as the method illustrated in FIG. 9 except for the following points.

The read unit 510 is located on the customer CS side, similar to the first display unit 310. Accordingly, the customer CS can have the read unit 510 read the electronic money or the credit card. Thus, the customer CS can perform the process necessary for checkout of products.

The read unit 520 is located on the clerk CR side, similar to the second display unit 320. Accordingly, the clerk CR can have the read unit 520 to read the product identification code. Thus, the clerk CR can perform the process necessary for registration of products.

Figure 20:
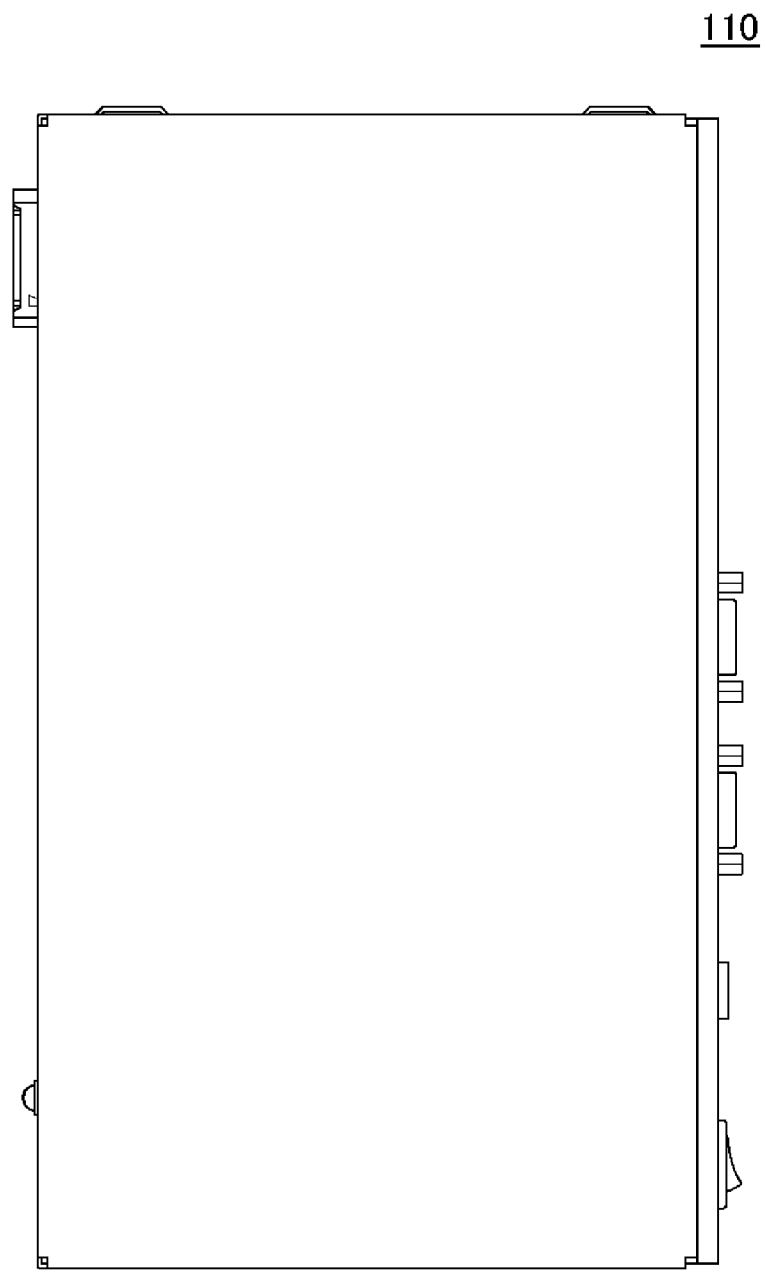
FIG. 20 is a side view of a control unit that is used in the product registration device illustrated in FIGS. 16 and 17.
Figure 21:
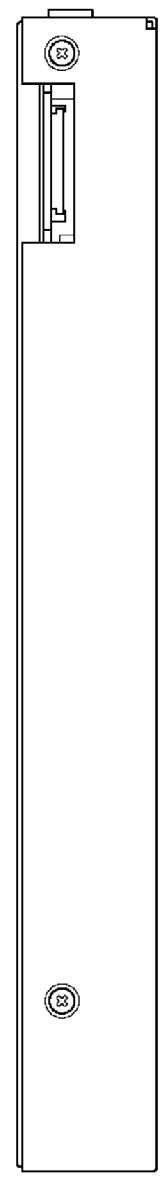
FIG. 21 is a front view of the control unit illustrated in FIG. 20.
Figure 22:
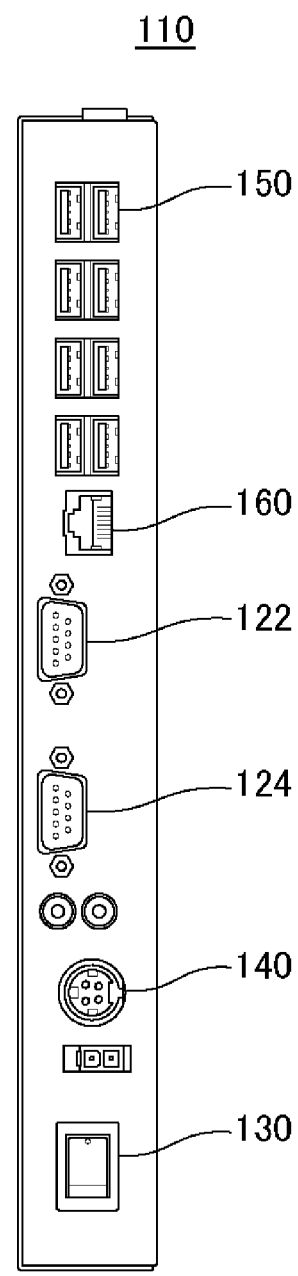
FIG. 22 is a rear view of the control unit illustrated in FIG. 20.
Figure 23:
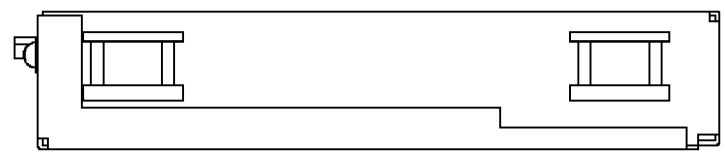
FIG. 23 is a top view of the control unit illustrated in FIG. 20.

FIG. 20 is a side view of the control unit 110 used in the product registration device 10 illustrated in FIGS. 16 and 17. FIG. 21 is a front view of the control unit 110 illustrated in FIG. 20. FIG. 22 is a rear view of the control unit 110 illustrated in FIG. 20. FIG. 23 is a top view of the control unit 110 illustrated in FIG. 20.

As illustrated in FIG. 22, the control unit 110 includes a connector 122, a connector 124, a switch 130, a power supply connector 140, a plurality of ports 150, and a LAN connector 160. The connector 122, the connector 124, the switch 130, the power supply connector 140, the plurality of ports 150, and the LAN connector 160 are provided on a common surface (a back surface) of the control unit 110. In other words, these are directed in the same direction.

The first display unit 310 (for example, FIGS. 16 and 17) can send a signal to the control unit 110 via the connector 122 and can receive a signal from the control unit 110 via the connector 122. The second display unit 320 (for example, FIGS. 16 and 17) can send a signal to the control unit 110 via the connector 124 and can receive a signal from the control unit 110 via the connector 124. In the example illustrated in FIG. 22, each of the connector 122 and the connector 124 is a 9-pin connector.

The control unit 110 can be turned on or off by the switch 130.

The control unit 110 can receive a power from the outside via the power supply connector 140.

The read unit 510 (for example, FIGS. 16 and 17) and the read unit 520 (for example, FIGS. 16 and 17) can send a signal to the control unit 110 via the port 150, and can receive a signal from the control unit 110 via the port 150. In the example illustrated in FIG. 22, the port 150 is a USB port.

The control unit 110 can connect to an external network (for example, a POS network) via the LAN connector 160.

In the example illustrated in FIGS. 16 and 17, the control unit 110 is accommodated inside the casing 100. Further, the control unit 110 may be placed such that the connector 122, the connector 124, the switch 130, the power supply connector 140, the plurality of ports 150, and the LAN connector 160 is located on the second display unit 320 side (that is, on the clerk side of the store). In this case, it is possible to prevent the customer of the store from accidentally touching the connector 122, the connector 124, the switch 130, the power supply connector 140, the plurality of ports 150, and the LAN connector 160.

Fifth Example Embodiment

Figure 24:
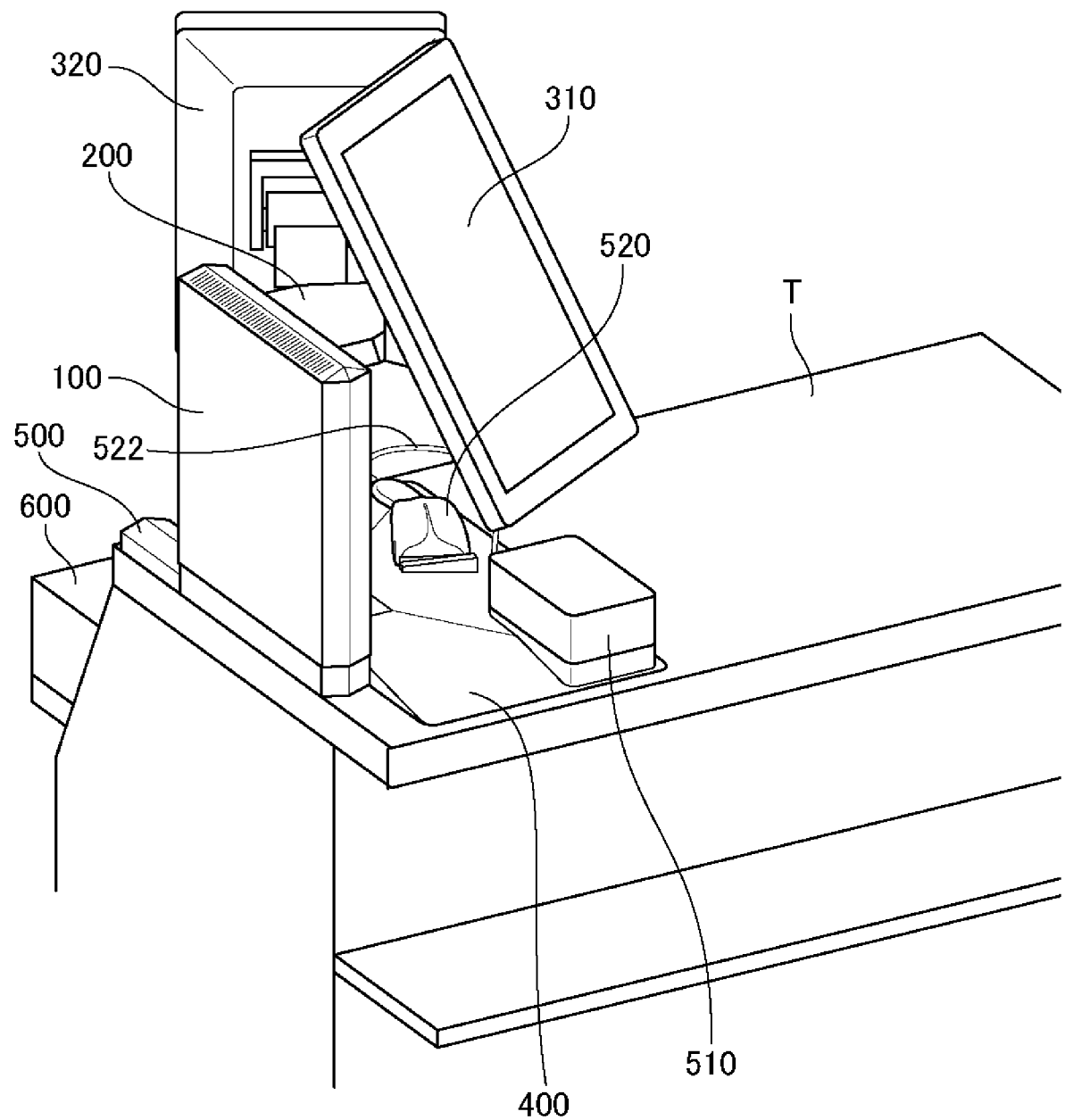
FIG. 24 is a perspective view illustrating a POS apparatus according to a fifth example embodiment.
Figure 25:
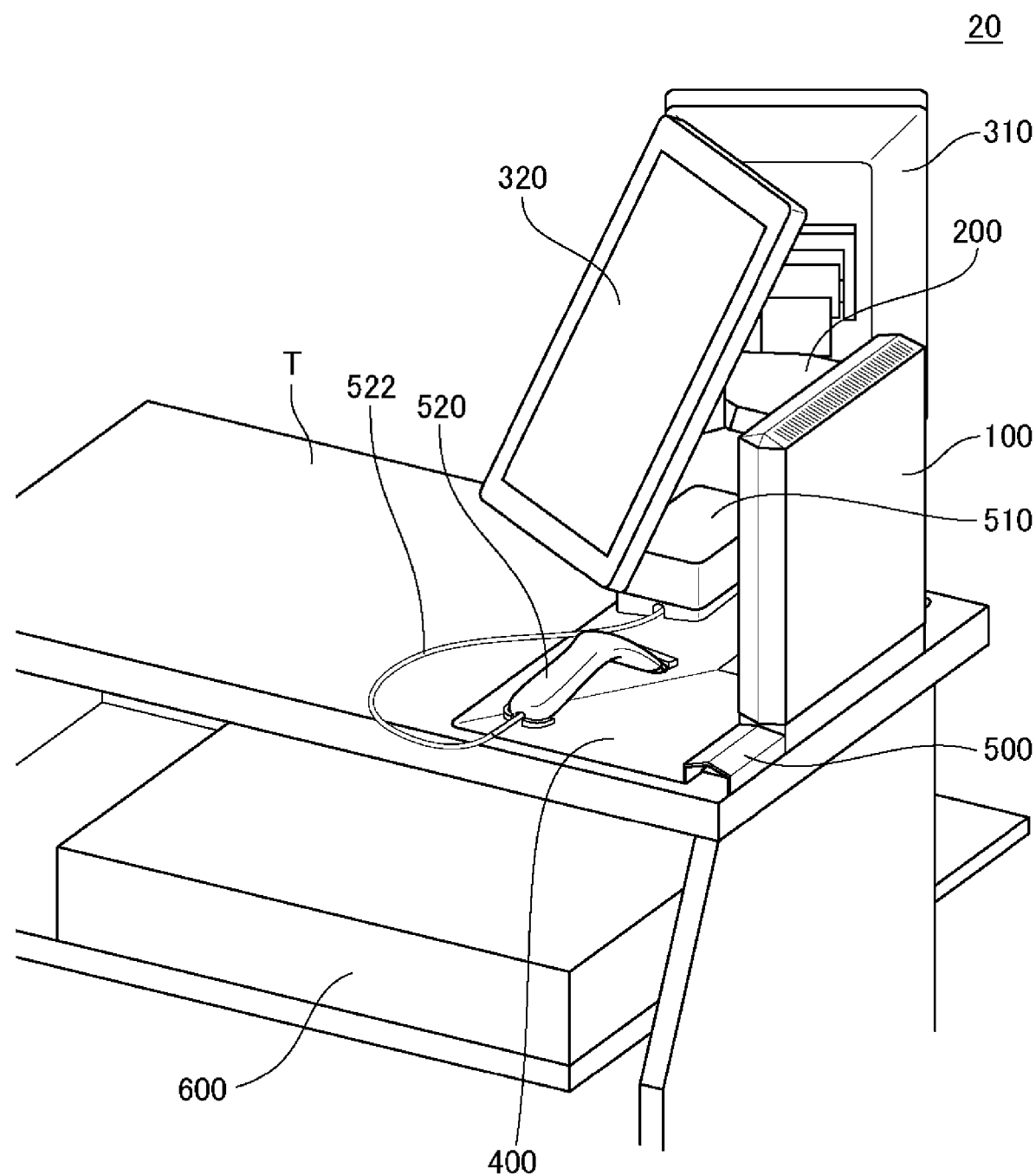
FIG. 25 is a perspective view of the POS apparatus illustrated in FIG. 24 as viewed in a direction different from that in FIG. 24.

FIG. 24 is a perspective view illustrating a POS apparatus 20 according to a fifth example embodiment, and corresponds to FIG. 16 of the fourth example embodiment. FIG. 25 is a perspective view of the POS apparatus 20 illustrated in FIG. 24 as viewed in a direction different from that in FIG. 24, and corresponds to FIG. 17 of the fourth example embodiment. The product registration device 10 according to the present example embodiment is the same as the product registration device 10 according to the fourth example embodiment.

The POS apparatus 20 includes a product registration device 10 and a money change device 600. The money change device 600 is placed in a shelf of the table T and is located lower than the product registration device 10. Coin and banknotes can be accommodated in the money change device 600, and the clerk can accommodate the coins and banknotes paid by the customer in the money change device 600. Further, the money change device 600 can dispense the coins and the banknotes, and the clerk can pass the coins or the banknotes dispensed from the money change device 600 to the customer as the change.

Figure 26:
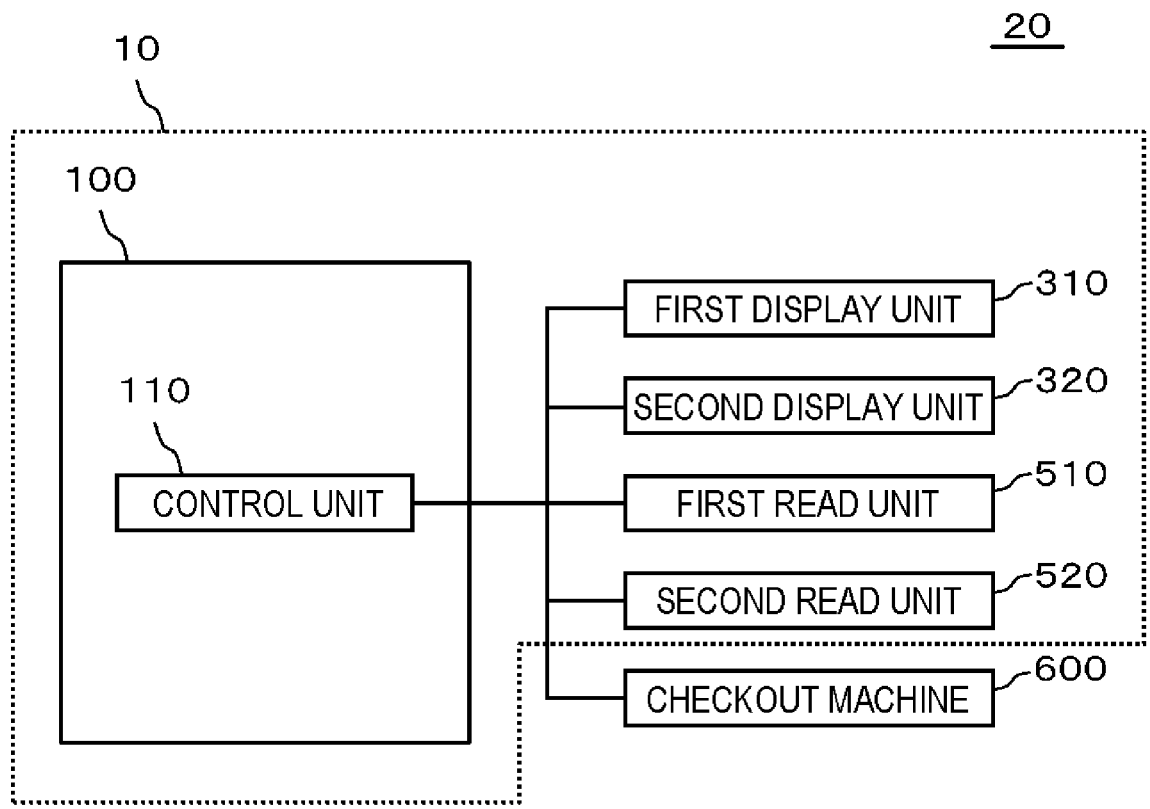
FIG. 26 is a block diagram illustrating the POS apparatus illustrated in FIG. 24 and FIG. 25.

FIG. 26 is a block diagram illustrating the POS apparatus 20 illustrated in FIGS. 24 and 25 and corresponds to FIG. 18 of the fourth example embodiment. The product registration device includes the casing 100, the first display unit 310, the second display unit 320, the read unit 510, the read unit 520, and the money change device 600, similar to FIGS. 24 and 25. The product registration device 10 illustrated in FIG. 26 is the same as the product registration device illustrated in FIG. 18.

The money change device 600 is controlled by the control unit 110. Specifically, the second display unit 320 (the display unit that is used by the clerk of the store) functions as a touch screen, and the control unit 110 controls the money change device 600 on the basis of a signal input via the second display unit 320.

In an example, when money (coins or banknotes) is inserted into the money change device 600, the money change device 600 sends a signal indicating the amount of money inserted into the money change device 600 to the control unit 110 on the basis of a signal from the control unit 110. Accordingly, the control unit 110 can calculate a total of the money inserted into the money change device 600.

In another example, when the clerk passes the change to the customer, the money change device 600 pays money corresponding to this change on the basis of a signal from the control unit 110. Accordingly, the clerk can pass the change to the customer.

Figure 27:
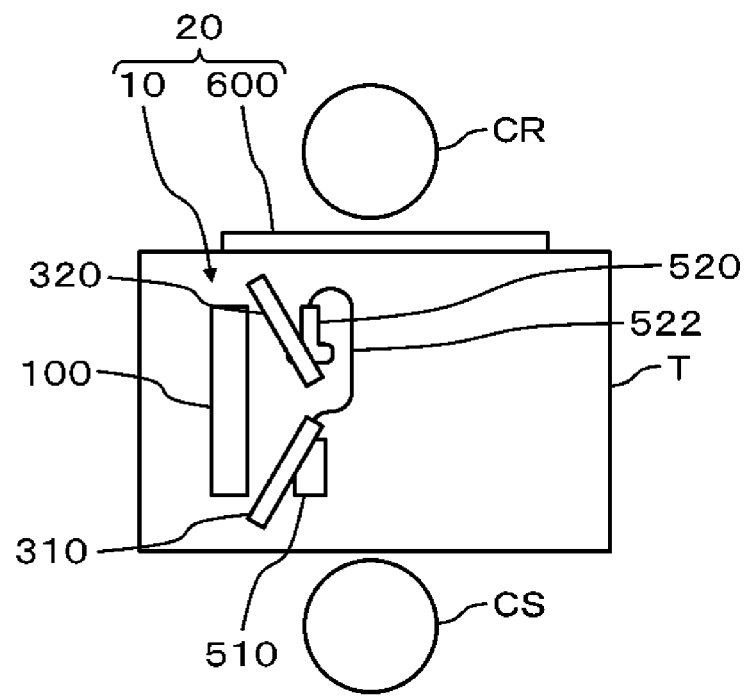
FIG. 27 is a diagram illustrating an example of a method of using the POS apparatus illustrated in FIGS. 24 and 25.

FIG. 27 is a diagram illustrating an example of a method of using the POS apparatus 20 illustrated in FIGS. 24 and 25, and corresponds to FIG. 19 of the fourth example embodiment. For description, the support portion 200 and the base 400 (FIGS. 24 and 25) are not illustrated in FIG. 27. The method illustrated in FIG. 27 is the same as the method illustrated in FIG. 19 except for the following points.

The money change device 600 is located on the clerk CR side, similar to the second display unit 320. Accordingly, the clerk CR can control the money change device 600 using the second display unit 320. Further, the clerk CR can accommodate the money paid from the customer CS in the money change device 600, and can pass the money dispensed from the money change device 600 to the customer CS as a change.

In the first to fifth example embodiments, the explanation is given to the casing 100 which is a rectangular parallelepiped of which the length of the side 103 in the height direction is longer than the length of any side (the long side 101 and the short side 102) of the bottom surface. Further, the explanation is given to the casing 100 that is configured to be placed such that the long side 101 of the bottom surface of the rectangular parallelepiped is substantially parallel to a direction in which the clerk or the customer faces when the product registration device 10 is placed on the table T facing the clerk or the customer. Alternatively, the casing 100 may be a rectangular parallelepiped of which the side 103 in the height direction and the long side 101 of the bottom surface have the same length, or a rectangular parallelepiped of which the length of the side 103 in the height direction is shorter than the length of the long side 101 of the bottom surface.

Further, an aspect may be adapted where when the product registration device 10 is placed on the table T that the clerk or the customer faces, the casing 100 which is a rectangular parallelepiped of which the length of the side 103 in the height direction is longer than the length of any side (the long side 101 and the short side 102) of the bottom surface is configured to be placed such that the short side 102 of the bottom surface of the rectangular parallelepiped is substantially parallel to the direction in which the clerk or the customer faces may be adopted.

Since the support portion 200 is provided on the side surface of the casing 100 surrounded by the side 103 in the height direction and the long side 101 of the bottom surface, space saving in the lateral direction (a direction perpendicular to the direction in which the clerk or the customer faces) can be achieved.

For the display unit, when the first display unit 310 is located in front of the casing 100 as illustrated in FIGS. 13 and 14, a space saving in the lateral direction can be achieved even when the first display unit 310 is horizontally long. In addition, the first display unit 310 and the second display unit 320 may be square.

Modification Example

Figure 28:
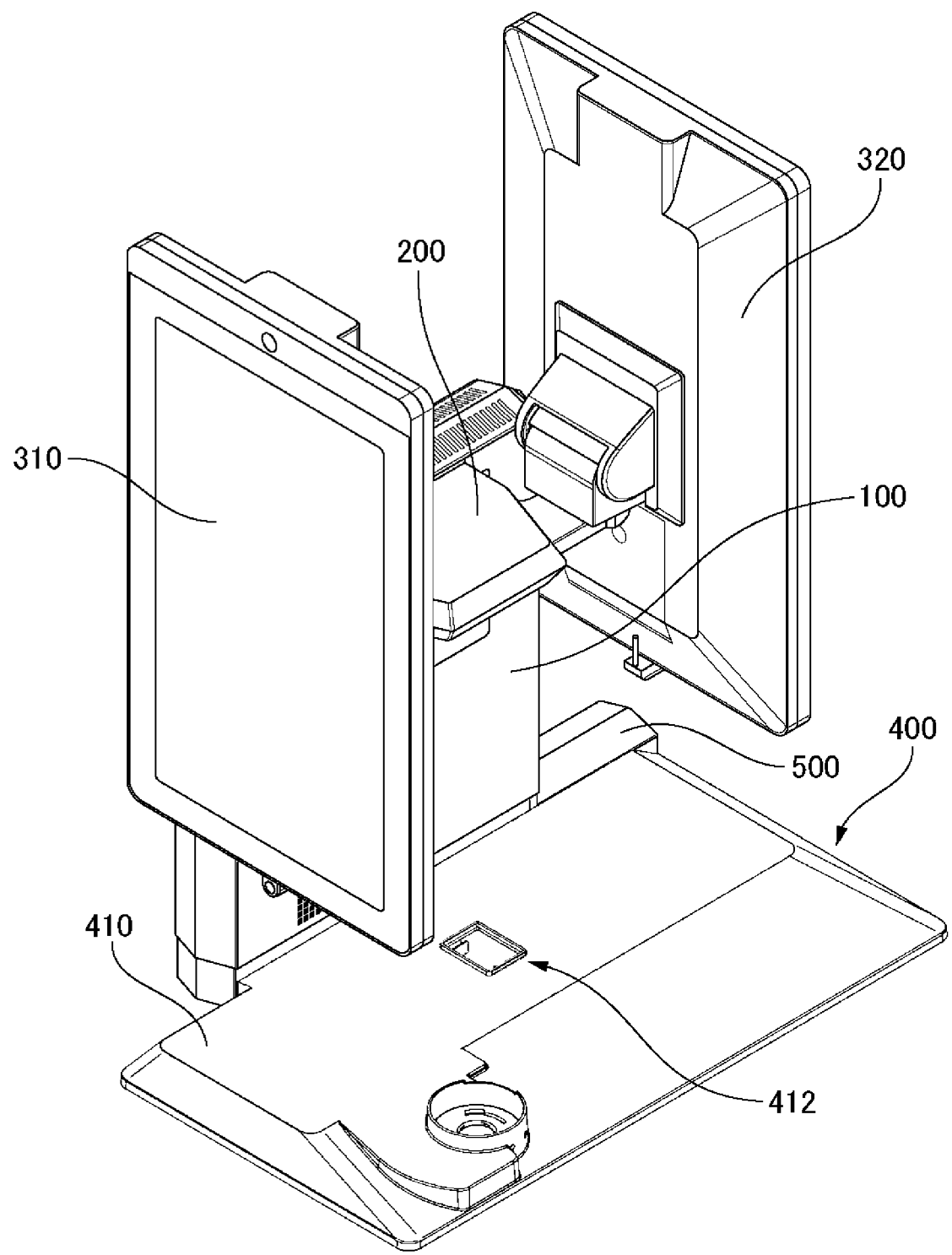
FIG. 28 is a perspective view illustrating a product registration device according to a modification example.

FIG. 28 is a perspective view illustrating a product registration device 10 according to a modification example. The product registration device 10 according to this modification example is the same as the product registration device 10 according to the third example embodiment except for the following points.

The base 400 has a flat surface 410. The flat surface 410 spreads over a wide range to some extent. Specifically, the flat surface 410 spreads over a wider range than the casing 100 in a long side direction of the bottom surface of the casing 100.

A peripheral device of the product registration device 10, especially a printer for printing a receipt can be placed on the flat surface 410 of the base 400. In this case, the printer can be directed to both the first display unit 310 side and the second display unit 320 side. Therefore, in a form in which the clerk performs the product registration process and the product price checkout process, it is possible to cause the printer to be directed to the clerk. In this case, it is easy for the clerk to take a receipt printed from the printer. Further, in a self-format and a semi-self format, it is possible to cause the printer to be directed to the customer side. In this case, it is easy for the customer to take the receipt printed from the printer.

An opening 412 is formed on the flat surface 410. In this case, a cable to be connected to the peripheral device of the product registration device 10 can pass through the opening 412. Thus, one end of the cable can be pulled out to the outside of the base 400. In particular, in the example illustrated in FIG. 28, the opening 412 is located approximately at a center of the flat surface 410. In this case, even when the peripheral device of the product registration device 10, especially the above-described printer is directed to any of the first display unit 310 side or the second display unit 320 side, a cable to be connected to this peripheral device can pass through a common opening (that is, the opening 412).

Although the example embodiments of the present invention have been described with reference to the drawings, these are examples of the present invention, and various configurations other than the above can be adopted.

The invention claimed is:

1. A product registration device comprising:
   a casing accommodating a control unit;
   a support portion;
   a first display unit supported on the casing by the support portion; and
   a second display unit supported on the casing by the support portion,
   wherein the casing is a substantially rectangular parallelepiped, a length of a side of the rectangular parallelepiped in a height direction being longer than a length of a short side forming a bottom surface of the rectangular parallelepiped,
   wherein the support portion comprises:
      a first support member provided on a side surface of the casing including one long side of the bottom surface,
      a second support member provided on the side surface of the casing and spaced apart from the first support member along the side surface of the casing,
      a third support member attached to the first support member, the third support member being rotatable about a first axis extending in the height direction through the first support member, and
      a fourth support member attached to the second support member, the fourth support member being rotatable about a second axis extending in the height direction through the second support member,
   wherein the first display unit is attached to the third support member and is rotatable about a third axis, the third axis extending in a direction different from the height direction through a portion of the third support member that overlaps with at least a portion of the first support member in the height direction, and
   wherein the second display unit is attached to the fourth support member and is rotatable about a fourth axis, the fourth axis extending in a direction different from the height direction through a portion of the fourth support member that overlaps with at least a portion of the second support member in the height direction.

2. The product registration device according to claim 1, wherein the first display unit is rectangular.

3. The product registration device according to claim 1, further comprising a basis extending to a side of the casing to which the support portion is provided.

4. The product registration device according to claim 1, wherein the basis has an inclination in a direction away from the casing.

5. The product registration device according to claim 1, wherein the first display unit is rotatable in a horizontal direction.

6. The product registration device according to claim 1, wherein the first display unit is rotatable in a vertical direction.

7. The product registration device according to claim 1, wherein
   the first support member is fixed to the casing.

8. The product registration device according to claim 1, wherein the second display unit is rotatable in a horizontal direction.

9. The product registration device according to claim 1, wherein the second display unit is rotatable in a vertical direction.

10. The product registration device according to claim 1, wherein
    the first support member is fixed to the casing.

11. The product registration device according to claim 1, wherein the first display unit and the second display unit function as a touch screen.

12. The product registration device according to claim 1, wherein the first display unit extends longer in the height direction than a lateral direction.

13. The product registration device according to claim 1, wherein the first axis intersects the third axis and the second axis intersects the fourth axis.

14. A point of sale (POS) apparatus comprising:
    a product registration device; and
    a checkout machine,
    wherein the product registration device comprises:
       a casing accommodating a control unit,
       a support portion,
       a first display unit supported on the casing by the support portion, and
       a second display unit supported on the casing by the support portion,
    wherein the casing is a substantially rectangular parallelepiped, a length of a side of the rectangular parallelepiped in a height direction being longer than a length of a short side forming a bottom surface of the rectangular parallelepiped,
    wherein the support portion comprises:
       a first support member provided on a side surface of the casing, the side surface of the casing including one long side of the bottom surface,
       a second support member provided on the side surface of the casing and spaced apart from the first support member along the side surface of the casing,
       a third support member attached to the first support member, the third support member being rotatable about a first axis extending in the height direction through the first support member, and
       a fourth support member attached to the second support member, the fourth support member being rotatable about a second axis extending in the height direction through the second support member,
    wherein the first display unit is attached to the third support member and is rotatable about a third axis, the third axis extending in a direction different from the height direction through a portion of the third support member that overlaps with at least a portion of the first support member in the height direction,
    wherein the second display unit is attached to the fourth support member and is rotatable about a fourth axis, the fourth axis extending in a direction different from the height direction through a portion of the fourth support member that overlaps with at least a portion of the second support member in the height direction, and
    wherein the checkout machine is controlled by the control unit.

15. The product registration device according to claim 14, wherein the first axis intersects the third axis and the second axis intersects the fourth axis.

* * * * *